(12) United States Patent
Nishida

(10) Patent No.: US 10,937,727 B2
(45) Date of Patent: Mar. 2, 2021

(54) SEMICONDUCTOR MODULE AND METHOD FOR MANUFACTURING SEMICONDUCTOR MODULE

(71) Applicant: FUJI ELECTRIC CO., LTD., Kawasaki (JP)

(72) Inventor: Yuhei Nishida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/362,120

(22) Filed: Mar. 22, 2019

(65) Prior Publication Data
US 2019/0341345 A1    Nov. 7, 2019

(30) Foreign Application Priority Data
May 1, 2018 (JP) ................................. JP2018-88148

(51) Int. Cl.
*H01L 23/498* (2006.01)
*H01L 21/48* (2006.01)
*H01L 23/00* (2006.01)

(52) U.S. Cl.
CPC .... *H01L 23/49844* (2013.01); *H01L 21/4853* (2013.01); *H01L 23/49811* (2013.01); *H01L 24/32* (2013.01); *H01L 2224/26175* (2013.01); *H01L 2924/13055* (2013.01); *H01L 2924/13091* (2013.01); *H01L 2924/3512* (2013.01)

(58) Field of Classification Search
CPC . H01L 2224/26175; H01L 2224/83815; H01L 23/488; H01L 23/49811; H01L 21/4853; H01L 24/29; H01L 24/32
See application file for complete search history.

(56) References Cited

U.S. PATENT DOCUMENTS

| | | | |
|---|---|---|---|
| 9,076,774 B2 | 7/2015 | Kumagai et al. | |
| 2007/0057373 A1* | 3/2007 | Okumura | H01L 23/49575 257/746 |
| 2013/0313711 A1 | 11/2013 | Kumagai et al. | |

FOREIGN PATENT DOCUMENTS

| | | | | |
|---|---|---|---|---|
| JP | 3-31848 A | 2/1996 | | |
| JP | 2003273306 A | * | 9/2003 | |
| JP | 2009218280 A | * | 9/2009 | ............ H01L 24/32 |
| JP | 2013-247256 A | 12/2013 | | |

* cited by examiner

*Primary Examiner* — Robert G Bachner
*Assistant Examiner* — Molly K Reida

(57) ABSTRACT

A semiconductor module includes a metal plate; a solder applied on the metal plate; a component-to-be-bonded mounted on the solder; and a linear guide portion delineated along a circumference of the component-to-be-bonded on a top surface of the metal plate, and including a metal surface having greater surface roughness than a peripheral region.

20 Claims, 19 Drawing Sheets

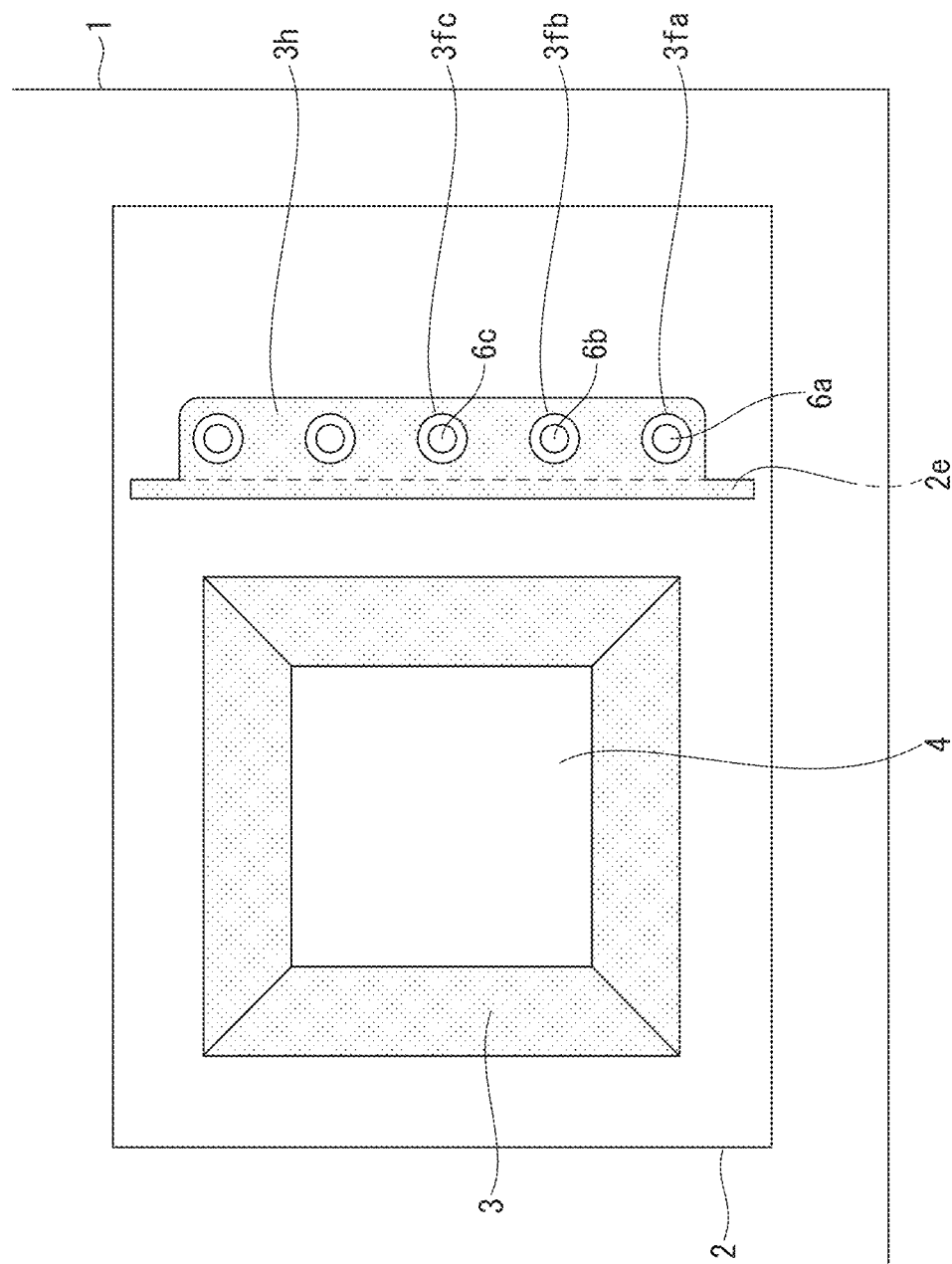

SEMICONDUCTOR MODULE AND METHOD FOR MANUFACTURING SEMICONDUCTOR MODULE

CROSS-REFERENCE TO RELATED APPLICATION

This application claims benefit of priority under 35 USC 119 based on Japanese Patent Application No. 2018-88148 filed on May 1, 2018, the entire contents of which are incorporated by reference herein.

BACKGROUND OF THE INVENTION

1. Field of the Invention

The present invention relates to a semiconductor module and a method for manufacturing a semiconductor module.

2. Description of the Related Art

When semiconductor chips or connection terminals in a semiconductor module is soldered on a metal foil, the solder increased in fluidity due to heating may be excessively spread over the circumference, causing failure such as interference with a wire bonding area. JP 08-031848 discloses a means of suppressing solder wettability by irradiating a periphery of a region in which a semiconductor chip is soldered on a top surface of a copper film, with a laser light so as to provide projections projecting from the top surface of the copper film using a copper oxide film. JP 08-031848 teaches that the projections block the spread of the solder flowing during soldering.

JP 2013-247256 discloses that a surface of a metal circuit layer is provided with linear grooves in which a metal oxide, such as a copper oxide, a nickel oxide and the like, is embedded, between a semiconductor chip and an ultrasonic metal connection region. JP 2013-247256 teaches that the surface of the metal oxide prevents the spread of a solder. Moreover, J P 2013-247256 discloses that the surface of the copper oxide or the nickel oxide is finely roughened, and the roughened surface of copper or nickel can prevent the spread of the melted solder.

However, the present inventors have found out through repeated examinations that the use of the oxide film or the oxide as disclosed in JP 08-031848 or JP 2013-247256 does not completely suppress wetting-spread of the solder effectively.

SUMMARY OF THE INVENTION

In response to the above issue, the present invention provides a new technical solution, different from the conventional means using the oxide film or the like, to deal with the above problems, and an object of the present invention is to provide a high-quality semiconductor module in which failure caused by excessive wetting-spread is avoided.

In order to solve the above problems, a semiconductor module according to an aspect of the present invention includes: (a) a metal plate; (b) a solder applied on the metal plate; (c) a component-to-be-bonded mounted on the solder; and (d) a linear guide portion delineated along a circumference of the component-to-be-bonded on a top surface of the metal plate, and including a metal surface having greater surface roughness than a peripheral region.

A method of manufacturing a semiconductor module according to an aspect of the present invention includes: (a) irradiating a circumference of a soldering-scheduled region on a top surface of a metal plate with a laser light to delineate a linear guide portion having a metal surface having greater surface roughness than a peripheral region; (b) applying a solder in the soldering-scheduled region; (c) mounting, on the applied solder, a component-to-be-bonded to the solder; (d) inhibiting a formation of an oxide film at an interface between the solder and the guide portion; and (e) trapping, on a surface of the guide portion, the solder flowing outward from the component-to-be-bonded, so as to guide the solder to flow in an extending direction of the guide portion.

BRIEF DESCRIPTION OF THE DRAWINGS

FIG. 18 is a schematic plan view illustrating a configuration of a semiconductor module according to a second embodiment;

DETAILED DESCRIPTION

Figure 1:
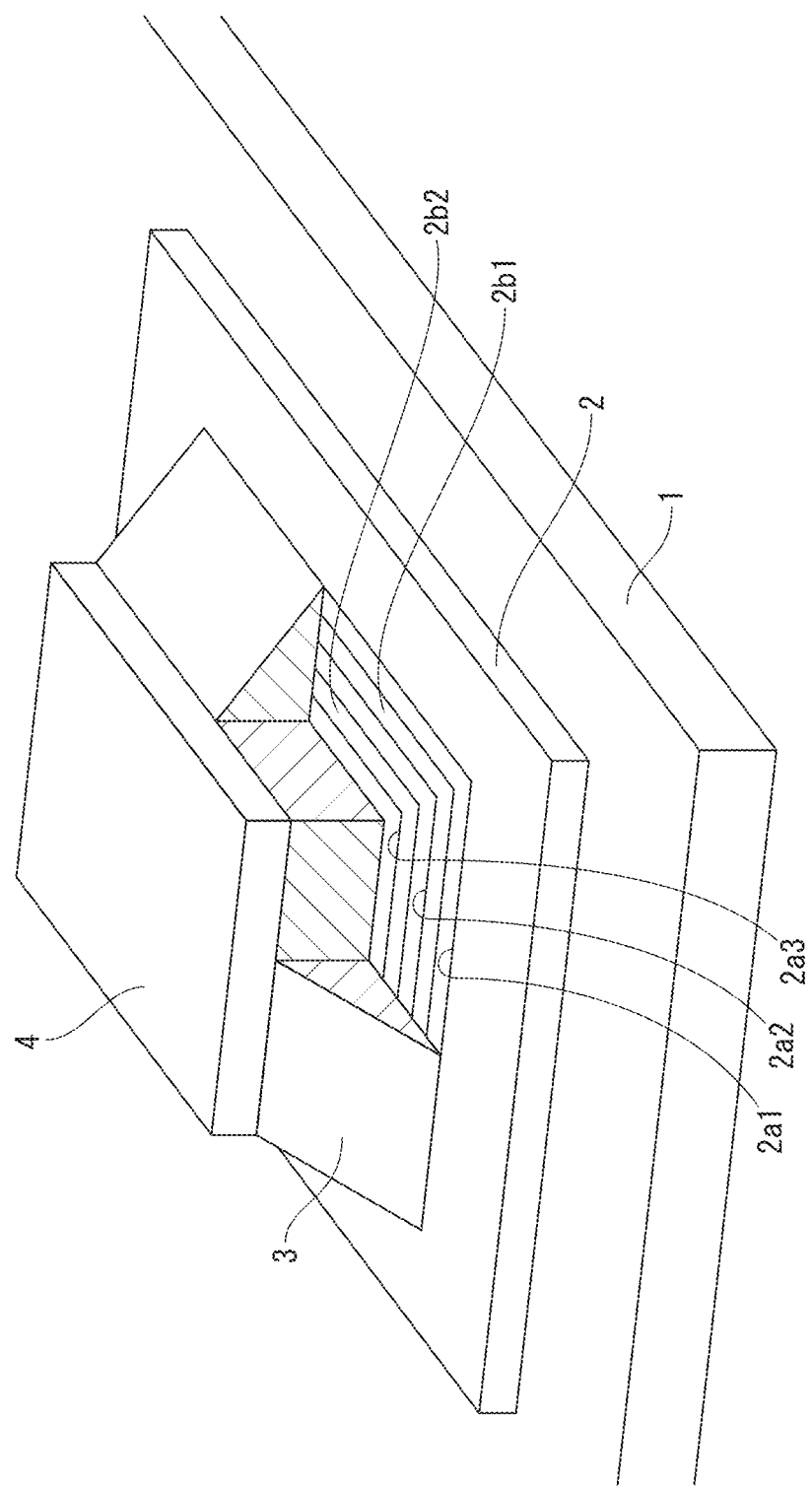
FIG. 1 is a schematic perspective view (a bird's-eye view) partly illustrating a configuration of a semiconductor module according to a first embodiment of the present invention.

Herein after, an embodiment of the present invention will be described below. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other. Further, in the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left". As used throughout this disclosure, the singular forms "a," "an," and "the" include plural reference unless the context clearly dictates otherwise. Thus, for example, a reference to "a composition" includes a plurality of such compositions, as well as a single composition.

First Embodiment

<Structure of Semiconductor Module>

As illustrated in FIG. 1, a semiconductor module according to a first embodiment includes a laminated substrate (1, 2) including an insulating plate 1 and a metal plate 2 bonded onto the insulating plate 1, and a solder 3 applied on the metal plate 2. A semiconductor chip 4 is mounted on the solder 3.

The top surface of the metal plate 2 is provided with three linear first guide portions 2a1, 2a2, 2a3 along the circumference of the semiconductor chip 4 at substantially regular intervals in parallel to each other. The first guide portions 2a1 to 2a3 are arranged so as to be entirely enclosed inside the solidified solder 3. As illustrated in the portion partly cut out in FIG. 1, two intermediate portions 2b1 and 2b2 are provided between the first guide portions 2a1 and 2a2, and between the first guide portions 2a2 and 2a3, respectively, adjacent to each other on the top surface of the metal plate 2.

The metal plate 2 includes a material having superior electrical conductivity. Examples of such materials include copper and a copper alloy. Alternatively, the metal plate 2 may be implemented by a substrate including copper, aluminum, or an alloy including at least one of copper and aluminum, and a surface layer, made of another material, laminated on the substrate. An example of the material of the surface layer may include nickel, gold, tin, and an alloy including at least one of nickel, gold and tin.

The metal plate 2 may be either a metallic foil or a lead frame having an appropriate shape depending on a circuit pattern. The semiconductor chip 4 is bonded onto the metal plate 2 via the solder 3. Further, an electronic components, such as a thermistor, a capacitor and the like, and a wiring member, such as connection terminals and the like, may be bonded onto the metal plate 2 via the solder 3, in addition to the semiconductor chip 4. Also, a bonding wire or a terminal block may be bonded onto the metal plate 2 as necessary, in addition to the semiconductor chip 4.

The insulating plate 1 may be placed below the metal plate 2. The insulating plate 1 includes an insulating material having high heat conductivity. The insulating material may be ceramics, such as aluminum oxide, aluminum nitride, silicon nitride and the like. Although not illustrated, other metal plate may be provided on the bottom surface of the insulating plate 1 in the same manner as the metal plate 2 provided on the top surface of the insulating plate 1. The other metal plate provided on the bottom surface of the insulating plate 1 may include a material having high heat conductivity. For a material of the other metal plate, for example, copper and a copper alloy may be adopted. Alternatively, the other metal plate may be implemented by a substrate including copper, aluminum, or an alloy including at least one of copper and aluminum, and a surface layer, made of another material, laminated on the substrate. An example of the material of the surface layer may include nickel, gold, tin, and an alloy including at least one of nickel, gold and tin. For example, a direct copper bonding (DCB) substrate and an active metal blazed (AMB) substrate may be used as the laminated substrate (1, 2) having the insulating plate 1 and the metal plate 2.

The semiconductor chip 4 is a power semiconductor chip which corresponds to a "component-to-be-bonded" according to the present invention. The semiconductor chip 4 includes a transistor element, such as an insulated gate bipolar transistor (IGBT) made of silicon or silicon carbide, and a metal oxide semiconductor field-effect transistor (MOSFET) and the like. The semiconductor chip 4 may further include a diode element, such as a Schottky barrier diode (SBD), a free-wheeling diode (FWD) and the like, as necessary. Although not illustrated, input/output current-terminals, signal terminals and the like, which are required as constituent elements of the semiconductor module, are electrically connected to predetermined bonding regions on the laminated substrate (1, 2), in addition to the semiconductor chip 4.

For the solder 3, a lead-free solder containing as a main component at least any alloy of a tin-silver-copper alloy, a tin-zinc-bismuth alloy, a tin-copper alloy, and a tin-silver-indium-bismuth alloy may be adopted. Further, the solder 3 may contain an additive, such as nickel, germanium, cobalt, silicon and the like.

In the semiconductor module, at least the top surface of the metal plate 2 and the periphery of the semiconductor chip 4 are closely sealed inward by a sealing resin having an insulating property in a state where the end portions of the required terminals or the like projects to be exposed to the outside. For the sealing resin, a thermosetting resin, such as an epoxy resin, a phenolic resin, a maleimide resin, a silicone resin, a silicone gel and the like, may be adopted. The sealing resin may include a filler, such as a silicon oxide, an aluminum oxide, a boron nitride, an aluminum nitride and the like. When the metal plate is provided on the bottom surface of the insulating plate 1, the bottom surface of the metal plate is exposed to the outside below the sealing resin so as to serve as a bottom surface for heat radiation of the semiconductor module.

Figure 2:
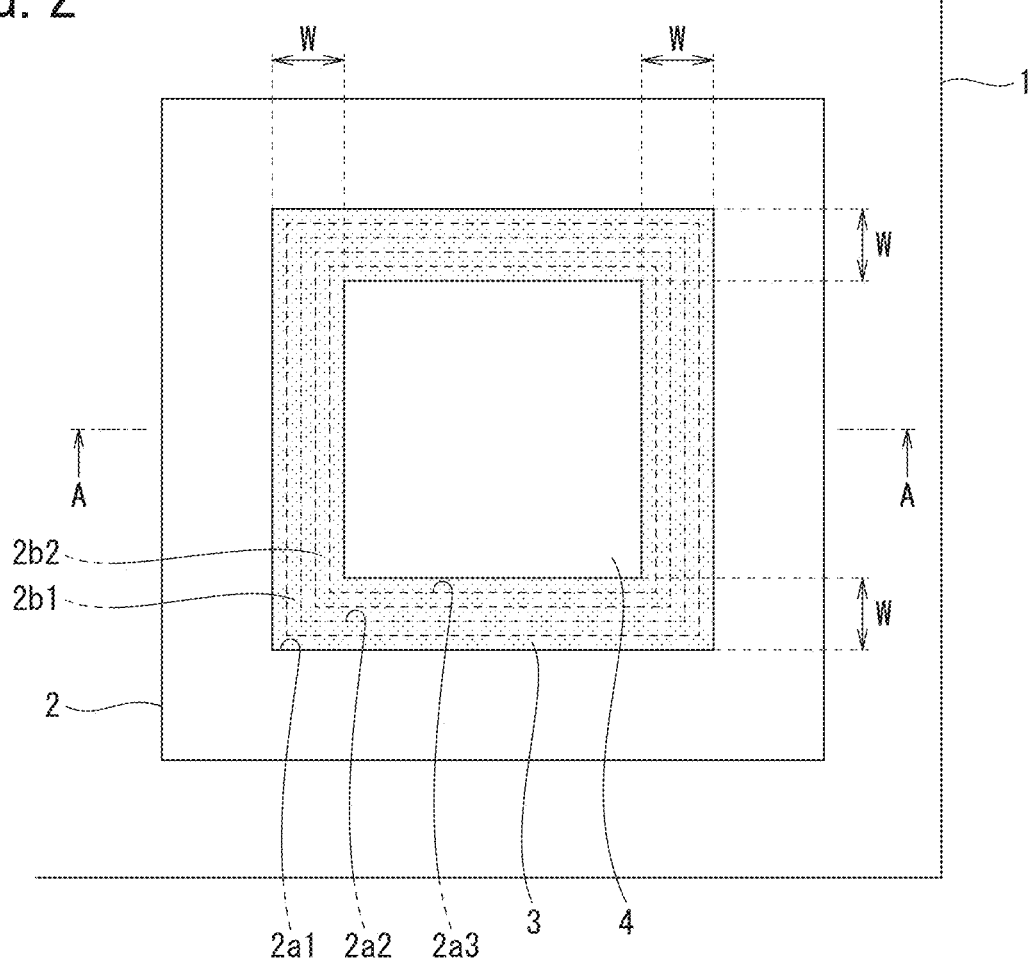
FIG. 2 is a schematic plan view illustrating the configuration of the semiconductor module according to the first embodiment.

FIG. 2 is a schematic plan view illustrating a configuration of the semiconductor module according to the embodiment. FIG. 2 is a top view as viewed from the semiconductor chip 4 side, indicating the three first guide portions 2a1 to 2a3 on the metal plate 2 below the solder 3 by the broken lines. As illustrated in FIG. 2, the respective outlines of the three first guide portions 2a1 to 2a3 are delineated in a rectangular frame-like shape along the circumference of the rectangular semiconductor chip 4 at substantially regular intervals in a planar pattern. The respective linear first guide portions 2a1 to 2a3 have no open ends so as to define closed surfaces inside the first guide portions 2a1 to 2a3. The inner edge of the rectangular outline of the innermost first guide portion 2a3 of the three first guide portions 2a1 to 2a3 and the rectangular outline of the semiconductor chip 4 overlap with each other at substantially the same position.

The guide portions 2a1 to 2a3 and the intermediate portions 2b1 and 2b2 illustrated in FIG. 2 are arranged so as to be entirely enclosed within a region having a predetermined width w along the circumference of the semiconductor chip 4. In FIG. 2, the solder 3 is illustrated with dotted hatching. As illustrated in FIG. 2, the guide portions 2a1 to 2a3 are arranged within a fillet of the solder 3 with the predetermined width w spreading outward from the semiconductor chip 4. The width w of the fillet is defined by a distance between the semiconductor chip 4 and the outermost first guide portion 2a1 of the three first guide portions 2a1 to 2a3 measured in a direction perpendicular to the extending direction of the guide portions 2a1 to 2a3.

The solder 3 extends from the rectangular outline of the semiconductor chip 4 to the outer edge of the rectangular outline of the outermost first guide portion 2a1 of the three first guide portions 2a1 to 2a3. The solder 3 is applied in the thickness direction to laminate from the bottom surface of the semiconductor chip 4 to the top surface of the metal plate 2, and also spreads over the intermediate portions 2b1 and 2b2 on the top surface of the metal plate 2.

Figure 3:
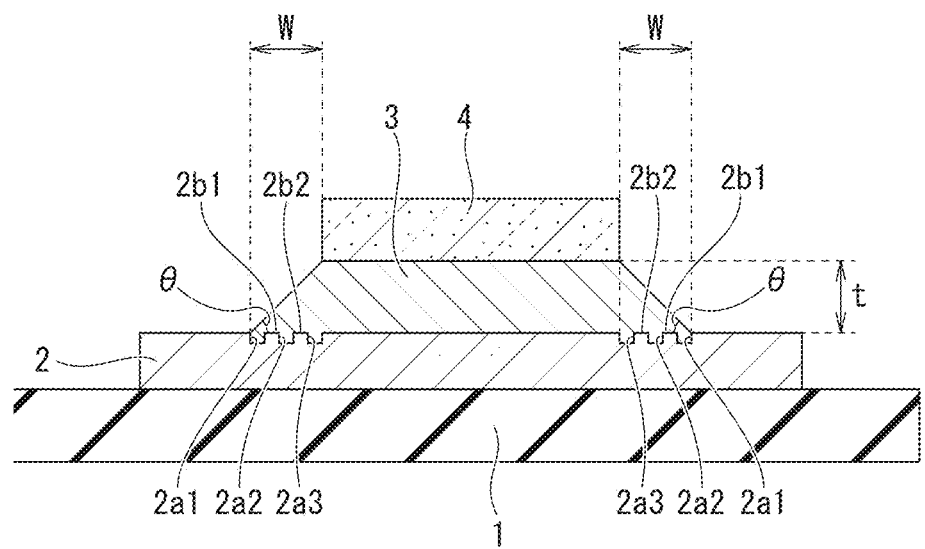
FIG. 3 is a cross-sectional view as viewed from direction A-A in FIG. 2.

FIG. 3 is a cross-sectional view illustrating a relationship between the semiconductor chip 4, the solder 3, and the metal plate 2. As illustrated in FIG. 3, the width w is set to substantially the same value as the thickness t of the solder 3, so that the angle θ between the top surface of the metal plate 2 and the inclined side surface of the solder 3 is 45 degrees or approximately 45 degrees. For example, when the width w and the thickness t are both set to about 100 nanometers, each width of the first guide portions 2a1 to 2a3 and each width of the intermediate portions 2b1 and 2b2 may be set to about 20 nanometers in order that the three first guide portions 2a1 to 2a3 and the two intermediate portions 2b1 and 2b2 arranged at regular intervals are enclosed within the region having the width w.

FIG. 3 illustrates the first guide portions 2a1 to 2a3 each formed into a shallow groove for illustration purposes, but the first guide portions 2a1 to 2a3 are not limited to the completely recessed state. The first guide portions 2a1 to 2a3 are only required not to project above the peripheral regions, and may be in an entirely flat state as separately viewed together with the peripheral regions. Each of the first guide portions 2a1 to 2a3 is a region of the metal plate 2 having rough uneven shapes with greater surface roughness than a region below the semiconductor chip 4, the peripheral intermediate portions 2ba and 2b2, and peripheral regions including the periphery of the first guide portions 2a1 to 2a3.

In the semiconductor module according to the first embodiment, no oxide films may be present at the contact interface between the solder 3 and the first guide portions 2a1 to 2a3, or oxide films may be distributed in a quite small region such that the oxide films are assumed substantially not to be present. The solder 3 is locally present only within the region inside the closed surfaces defined by the first guide portions 2a1 to 2a3 while being in direct contact with the top surfaces of the first guide portions 2a1 to 2a3 with no oxide films interposed, without deviating from the designed shape of the fillet.

<Method of Manufacturing Semiconductor Module>

Figure 4:
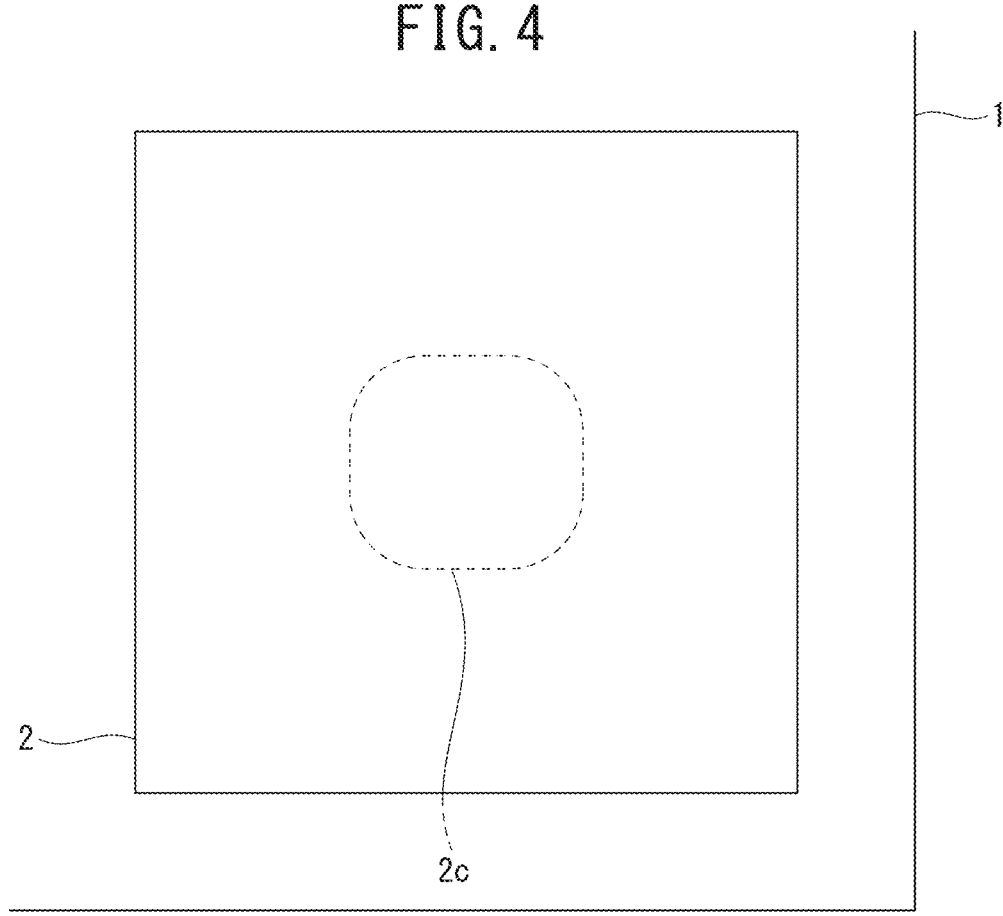
FIG. 4 is a schematic plan view illustrating a step (I) of a manufacturing method for the semiconductor module according to the first embodiment.

A method of manufacturing the semiconductor module according to the first embodiment is described below with reference to FIGS. 4 to 14. First, as illustrated in FIG. 4, the laminated substrate (1, 2) is prepared in which the metal plate 2 is laminated on the insulating plate 1. FIG. 4 illustrates a first soldering-scheduled region 2c, defined by a rectangular shape indicated by the broken line in the middle of the top surface of the metal plate 2, in which the solder 3 for bonding the semiconductor chip 4 is arranged in the later step.

Figure 5:
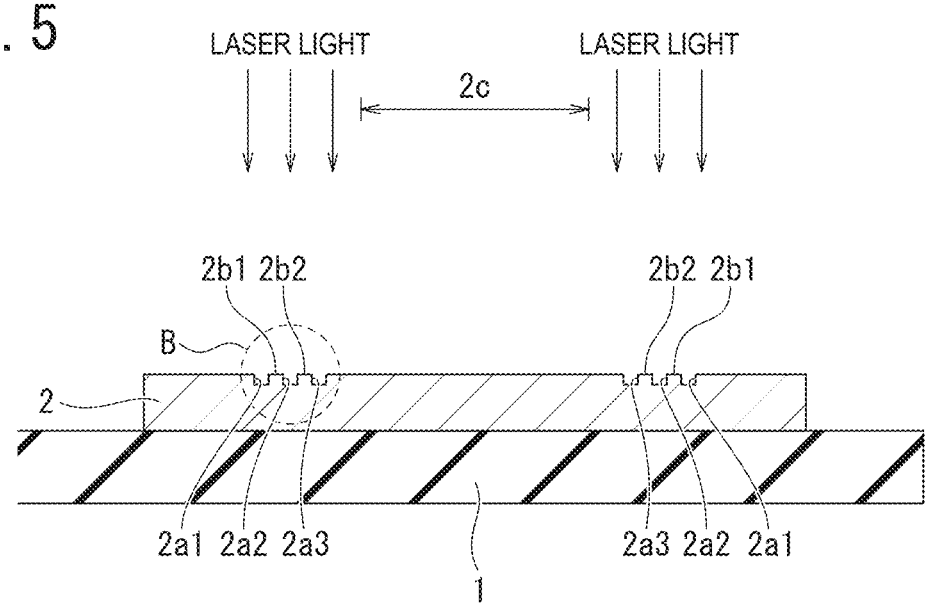
FIG. 5 is a schematic cross-sectional view illustrating a step (II) of the manufacturing method for the semiconductor module according to the first embodiment.
Figure 6:
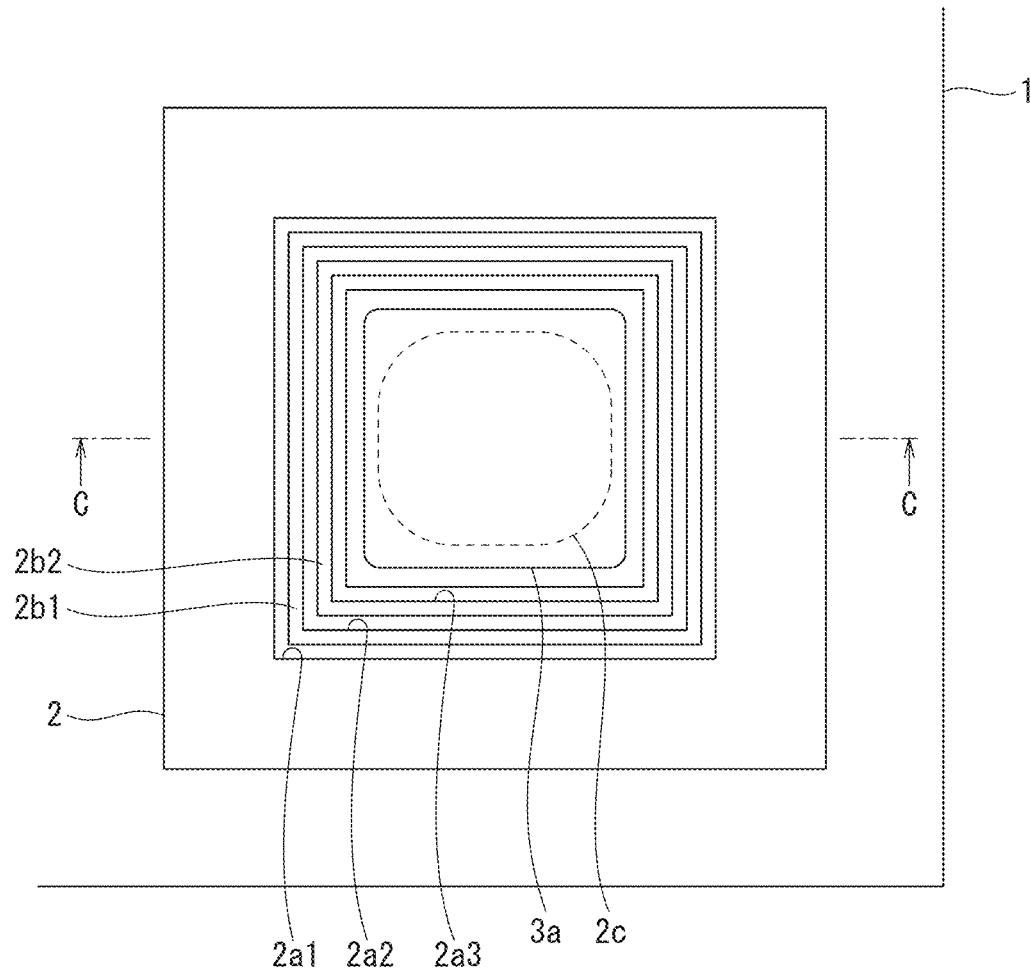
FIG. 6 is a schematic plan view illustrating a step (III) of the manufacturing method for the semiconductor module according to the first embodiment.

As illustrated in FIG. 5, the three first guide portions 2a1 to 2a3 are delineated in a frame-like shape at the circumference of the first soldering-scheduled region 2c on the top surface of the metal plate 2 so as to define the closed surfaces inside the first guide portions 2a1 to 2a3. FIG. 5 is a cross-sectional view of the semiconductor module before the solder 3 is applied, as viewed from direction C-C in FIG. 6. The first guide portions 2a1 to 2a3 can be obtained such that the top surface of the metal plate 2 is directly irradiated with a laser light such as an excimer laser having predetermined energy density, or is subjected to scanning irradiation via a mask having a preferred opening pattern, for example. The laser light is not limited to the excimer laser, and may be a YAG laser or a carbon dioxide laser. The frame-like first guide portions 2a1 to 2a3 are thus delineated by the irradiation of the laser light as illustrated in FIG. 6.

Figure 7A:
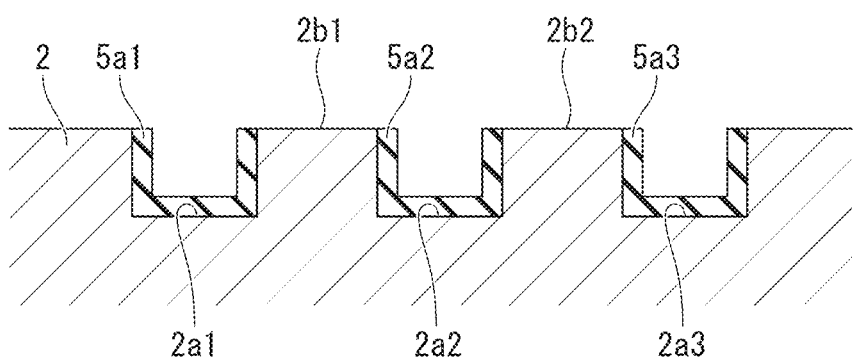
FIG. 7A is an enlarged view of part B illustrated in FIG. 5.
Figure 7B:
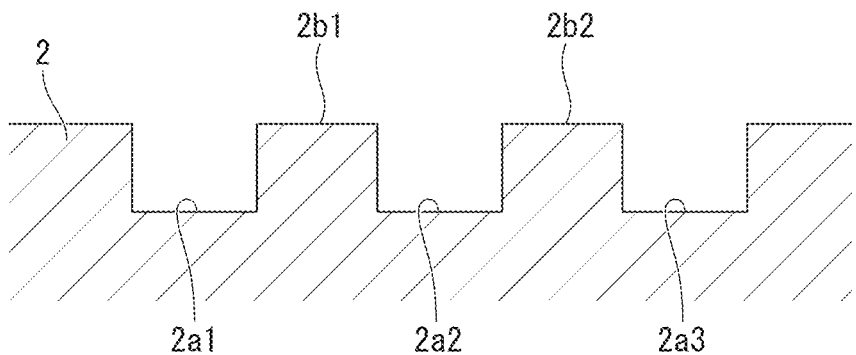
FIG. 7B is an enlarged view of part E illustrated in FIG. 13.

When the laser light is irradiated in an atmosphere containing oxygen (02), the surface of the irradiated regions on the top surface of the metal plate 2 are provided with oxide films 5a1 to 5a3, as illustrated in FIG. 7A. Although, in FIG. 7A grooves are schematically illustrated as the regions irradiated with the laser light, an actual surface profile is not limited to the illustration. The first guide portions 2a1 to 2a3 in which the oxide films 5a1 to 5a3 are formed, may be in a protruding-shape, in a even-shape, or in a recessed-shape, as compared with the peripheral region. The first guide portions 2a1 to 2a3 having the oxide films 5a1 to 5a3 are regions in the metal plate 2 each having a surface roughness higher than that of the peripheral region and a rough uneven shape. The method of manufacturing the semiconductor module according to the first embodiment includes a step of removing the preliminarily formed oxide films 5a1 to 5a3 later, as a step of inhibiting the formation of the oxide films 5a1 to 5a3.

An example of the step of removing the oxide films 5a1 to 5a3 is a reduction treatment. The reduction treatment is executed in a soldering step using a solder including a flux containing a reductant after the irradiation with the laser light, for example. The oxide films 5a1 to 5a3 on the surfaces of the first guide portions 2a1 to 2a3 are removed such that the flux is brought into contact with the surfaces of the first guide portions 2a1 to 2a3 by heating such as reflow treatment in the soldering step. For the flux containing the reductant, a rosin reductant such as abietic acid, a solvent such as butyl carbitol, and the like may be adopted. Further, the flux may include an acrylic or polyether polymer, a thixotropic agent such as triglyceride or fatty acid ester, and an activator such as adipic acid or fumaric acid, as appropriate. Although, in FIG. 7B, the groves are schematically illustrated as the regions irradiated with the laser light, the actual surface profile is not limited to the illustration. The first guide portions 2a1 to 2a3 from which the oxide films 5a1 to 5a3 have been removed, may be even or recessed, as compared with the peripheral regions. The first guide portions 2a1 to 2a3 from which the oxide films 5a1 to 5a3 are removed are regions in the metal plate 2 each having a surface roughness higher than that of the peripheral region and a rough uneven shape, as compared with the peripheral regions.

Figure 8:
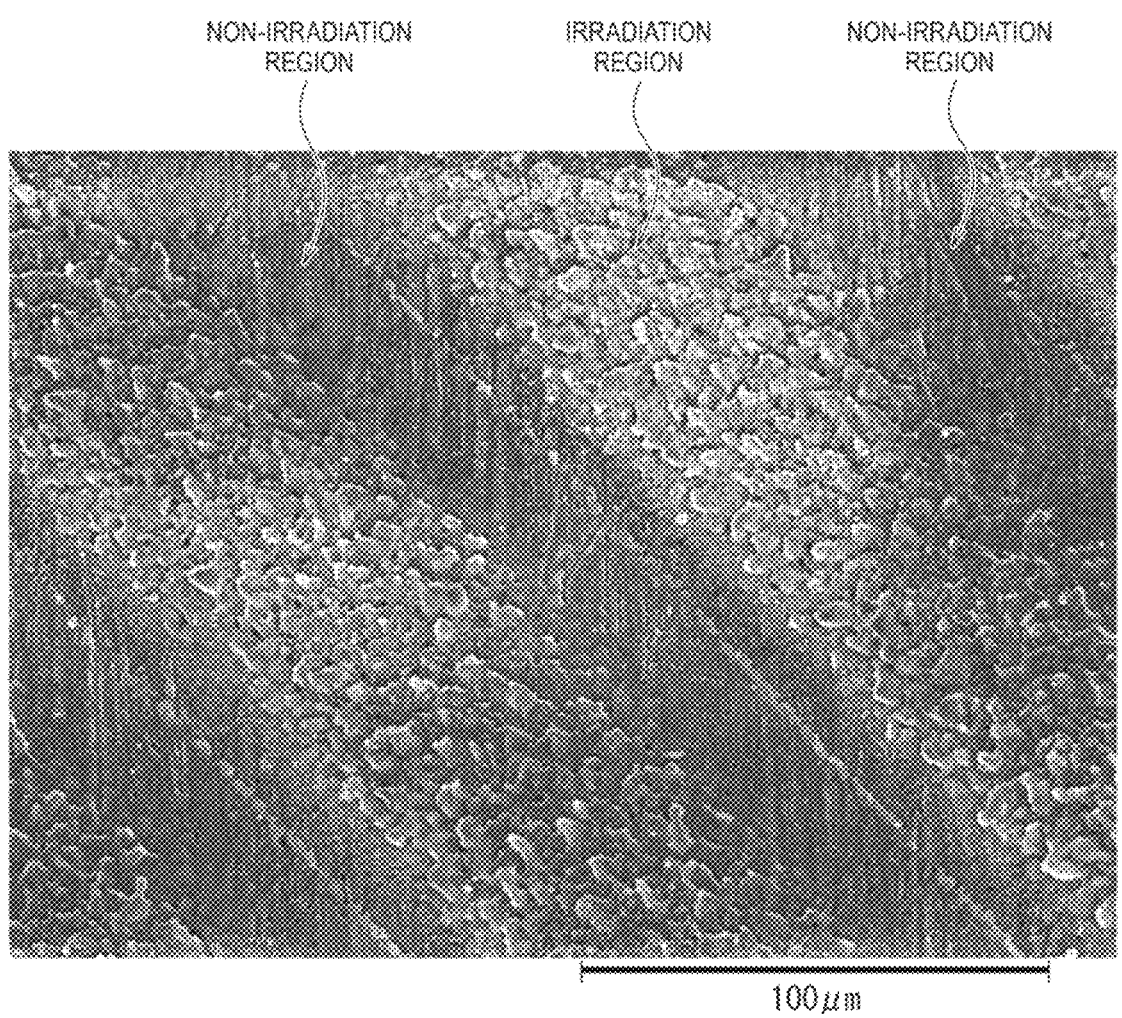
FIG. 8 is a scanning electron microscope (SEM) image of a top surface of a metal plate on which oxide films remain after being irradiated with a laser light without reduction treatment performed.
Figure 9:
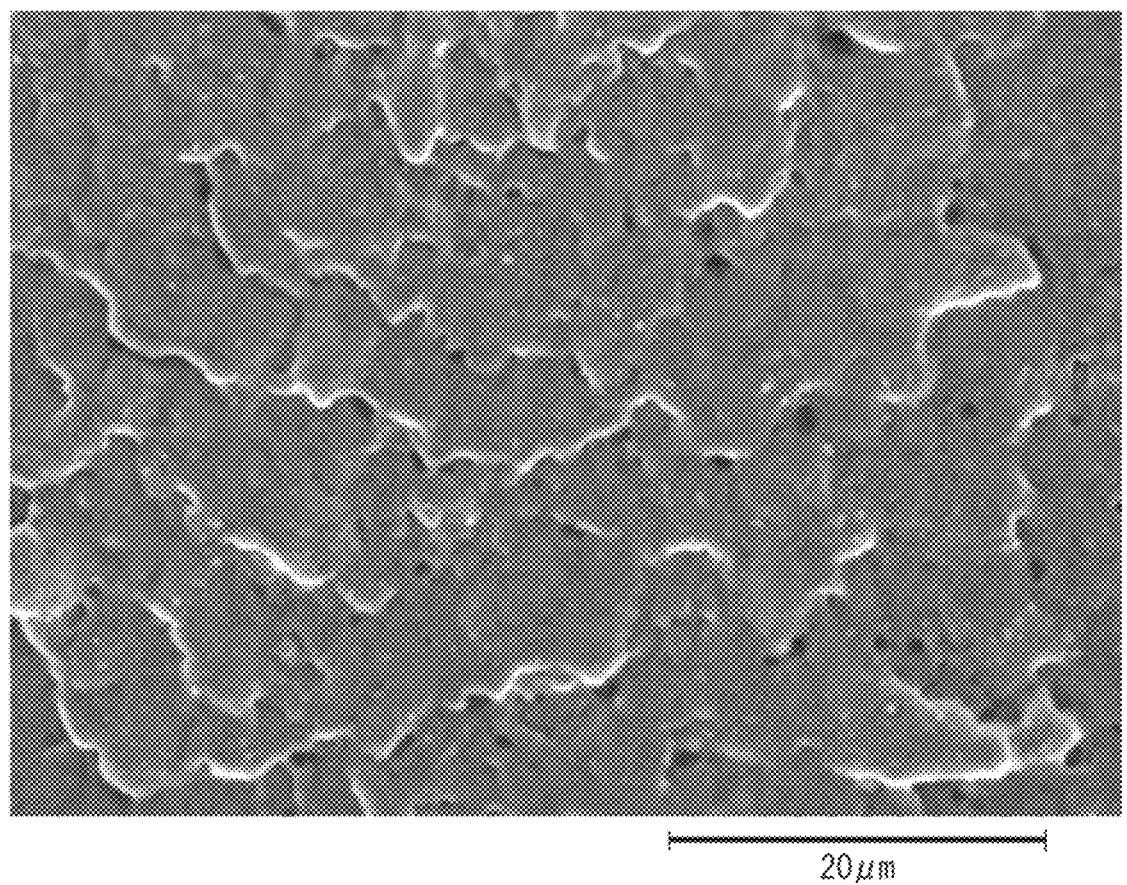
FIG. 9 is a partly-enlarged image of the region irradiated with the laser light illustrated in FIG. 8.

FIG. 8 is a SEM image of the top surface of the metal plate 2 on which the oxide films remain after being irradiated with the laser light without executing the reduction treatment so as to estimate the conditions of the top surface of the metal plate 2 having the oxide films 5a1 to 5a3. The image in FIG. 8 illustrates a state of the top surface of the metal plate 2 including irradiation regions and non-irradiation regions with the laser light at a magnification of 500 times, and the image in FIG. 9 illustrates a state of the irradiation region with the laser light in the top surface of the metal plate 2 at a magnification of 2000 times. FIG. 8 illustrates the state in which a plurality of scaly tracks of the laser light irradiated while moving extend from the upper left side to the lower right side. As illustrated in FIG. 8, the irradiation regions with the laser light corresponding to the first guide portions 2a1 to 2a3 in the metal plate 2 are increased in surface roughness and have rough uneven shapes as compared with peripheral non-irradiation regions.

Figure 10:
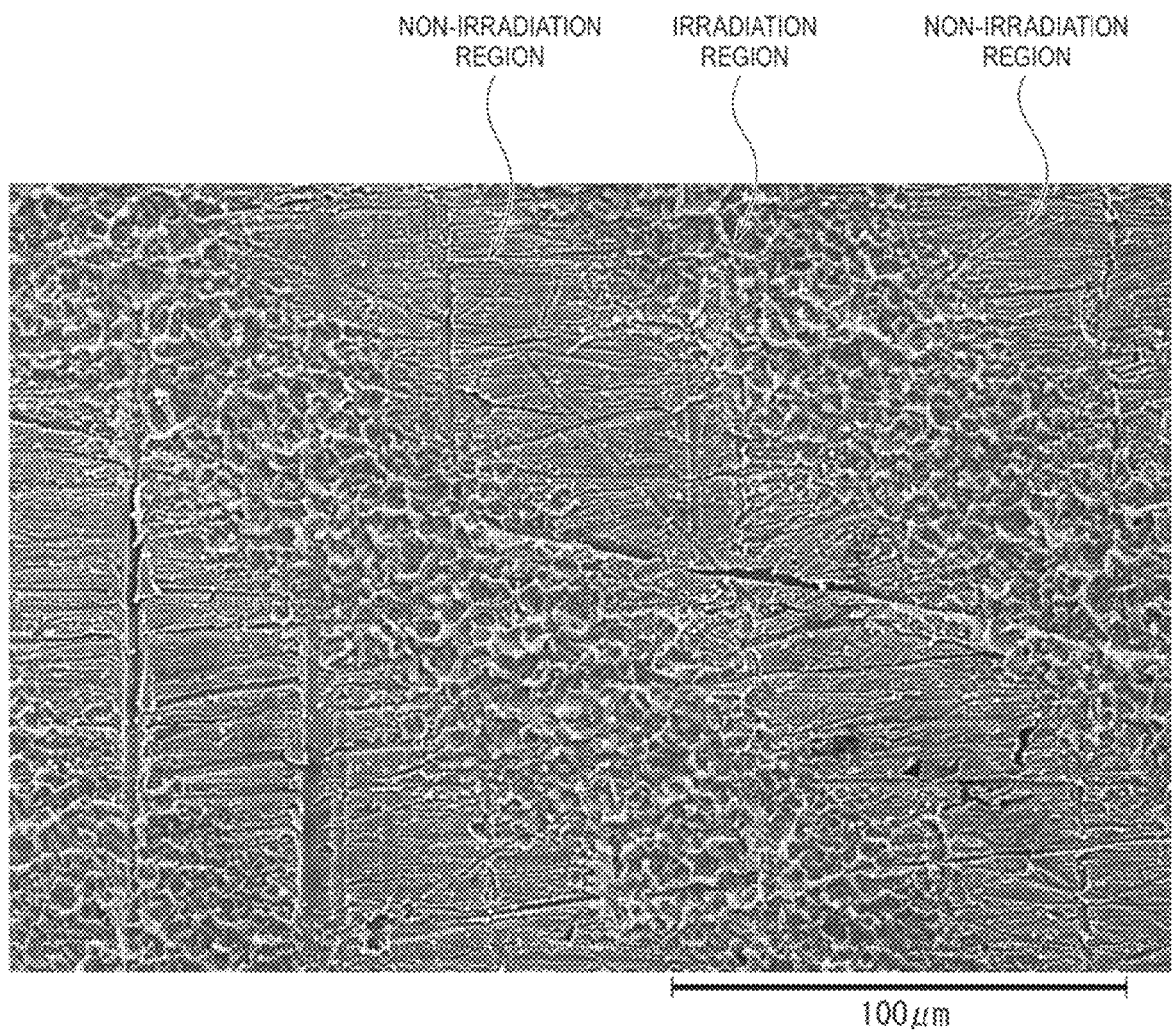
FIG. 10 is a SEM image of the top surface of the metal plate from which the oxide films are removed after being irradiated with the laser light and then subjected to reduction treatment.
Figure 11:
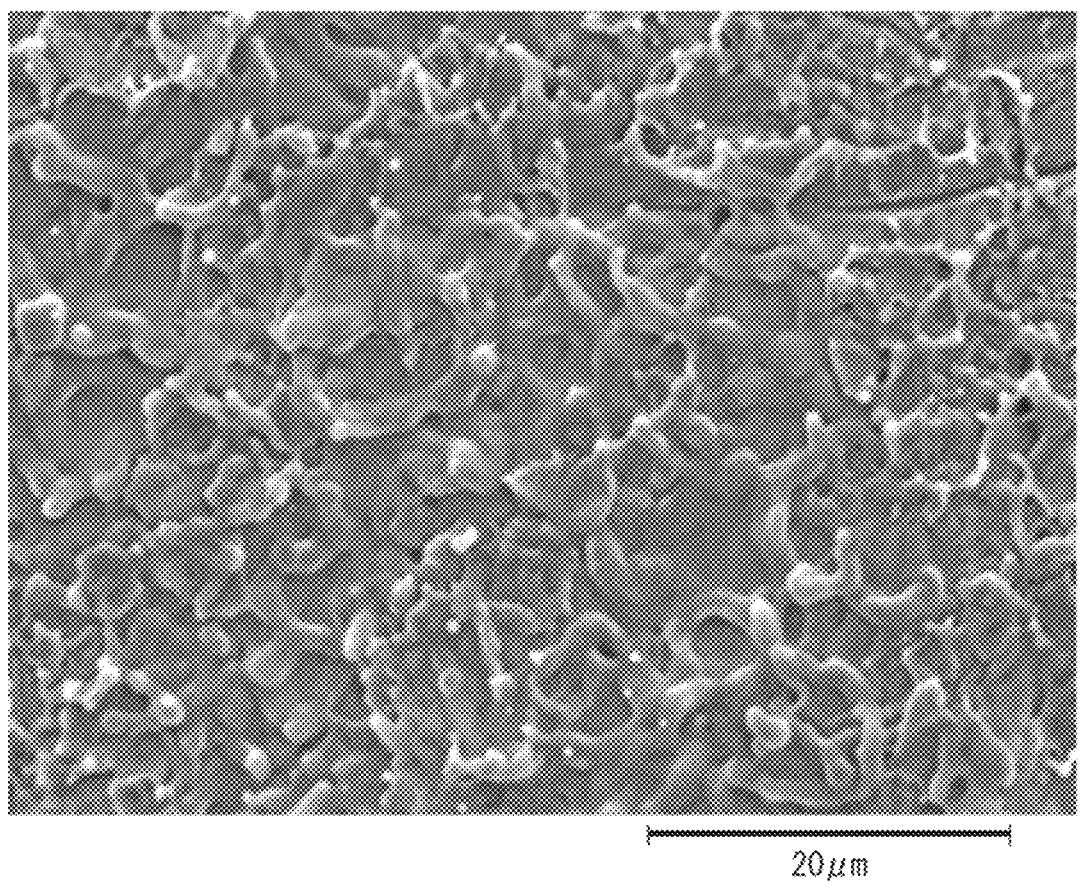
FIG. 11 is a partly-enlarged image of the region irradiated with the laser light illustrated in FIG. 10.

FIG. 10 is a SEM image of the top surface of the metal plate 2 from which the formed oxide films 5a1 to 5a3 are removed after irradiation with the laser light and subjected to the reduction treatment so as to estimate the state of the top surface of the metal plate 2 from which the oxide films 5a1 to 5a3 have been removed. The image in FIG. 10 illustrates the state of the top surface of the metal plate 2 including irradiation regions and non-irradiation regions with the laser light at a magnification of 500 times and an image in FIG. 11 illustrates a state of the irradiation region with the laser light in the top surface of the metal plate 2 at a magnification of 2000 times. FIG. 10 illustrates the state in which a plurality of scaly tracks of the laser light irradiated while moving, extend from the upper left side to the lower right side, as in the case of FIG. 8. As illustrated in FIG. 10, the irradiation regions with the laser light corresponding to the first guide portions 2a1 to 2a3 in the metal plate 2 are increased in surface roughness and have rough uneven shapes as compared with the peripheral non-irradiation regions.

As compared with the case illustrated in FIG. 9 and FIG. 11, the top surface of the metal plate 2 from which the oxide films are removed as illustrated in FIG. 11, is roughened more than the case without the oxide films removed as illustrated in FIG. 8. It is apparent from the comparison between FIG. 9 and FIG. 11 that the removal of the oxide films 5a1 to 5a3 from the surfaces of the first guide portions 2a1 to 2a3 increases the surface roughness more than the surface roughness of the intermediate portions 2b1 and 2b2 which correspond to the non-irradiation regions with laser light.

As illustrated in FIG. 6, the solder 3a is applied on the first soldering-scheduled region 2c inside the rectangular closed surfaces of the first guide portions 2a1 to 2a3. The solder 3a to be applied is only required to be flowable in the later process, and may be a cream solder or a chip solder. The use of the solder including the flux containing the reductant described above can remove the oxide films 5a1 to 5a3.

The volume of the solder 3a to be applied is determined so that the space between the top surface of the metal plate 2 and the bottom surface of the semiconductor chip 4 does not protrude outward from the outermost first guide portion 2a1 on the metal plate 2, in consideration of the volume of the solder 3 after solidification.

Figure 12:
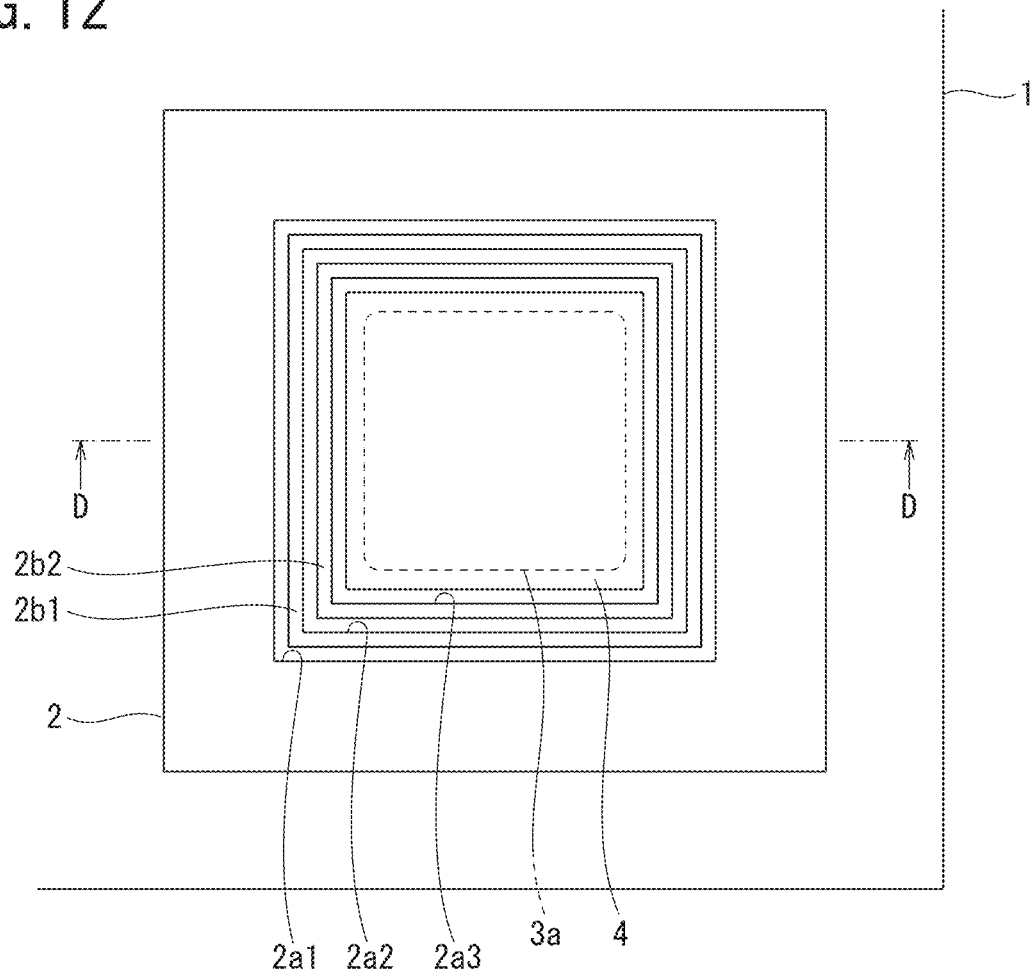
FIG. 12 is a schematic plan view illustrating a step (IV) of the manufacturing method for the semiconductor module according to the first embodiment.
Figure 13:
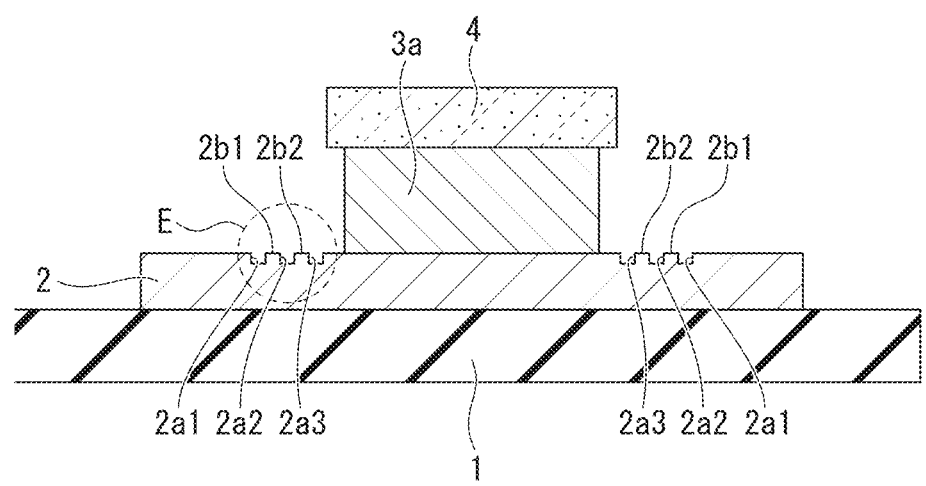
FIG. 13 is a cross-sectional view as viewed from direction D-D in FIG. 12.

Subsequently, the semiconductor chip 4 is mounted on the applied solder 3a, as illustrated in FIG. 12 and FIG. 13.

Figure 14A:
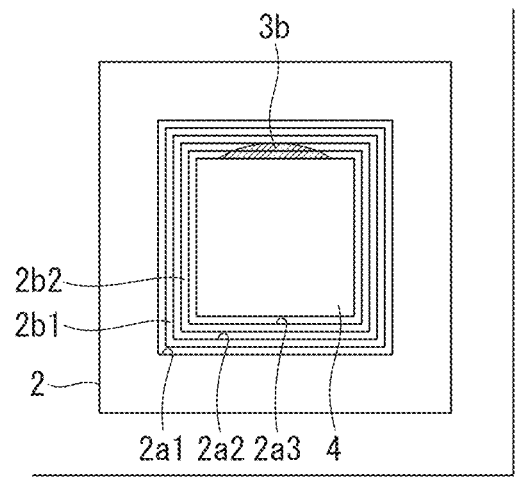
FIGS. 14A to 14D are schematic plan views illustrating a step (V) of the manufacturing method for the semiconductor module according to the first embodiment, the step proceeding sequentially in the order of FIG. 14A, FIG. 14B, FIG. 14C, and FIG. 14D.

In the soldering step, the solder 3a is heated at a predetermined temperature and melted by reflow treatment and the like. As illustrated in FIG. 14A, the solder 3b, which is melted and increased in fluidity, flows to spread to the outside of the semiconductor chip 4. FIG. 14A illustrates the solder 3b, indicated by hatching, spreading upward from the upper side of the semiconductor chip 4.

When the solder 3b flows, the oxide films 5a1 to 5a3 on the surfaces of the first guide portions 2a1 to 2a3 are removed and increase the surface roughness increases. The wettability of the solder 3b on the surfaces of the first guide portions 2a1 to 2a3 is greatly enhanced more than the wettability on the intermediate portions 2b1 and 2b2. Therefore, the solder 3b flowing to the innermost first guide portion 2a3 of the three first guide portions 2a1 to 2a3 is thus firmly bound, or trapped on the surface of the first guide portion 2a3, so as to greatly inhibit the flow of the solder 3b flowing to the top surface of the adjacent intermediate portion 2b2 illustrated on the upper side of the first guide portion 2a3 in FIG. 14A. The solder 3b is then guided to spread outward from the middle portion in FIG. 14A more in the right-left direction which is the extending direction of the first guide portions 2a1 to 2a3 than in the direction from the semiconductor chip 4 toward the intermediate portions 2b1 and 2b2 (in the direction from the lower side to the upper side in FIG. 14A).

When all of the flowing solder 3b cannot be trapped on the surface of the innermost first guide portion 2a3, the remaining solder 3b which is not trapped, then temporality moves to the top surface of the adjacent intermediate portion 2b2 illustrated on the upper side of the first guide portion 2a3 in FIG. 14A. The remaining solder 3b still not trapped on the top surface of the intermediate portion 2b2 further moves to the surface of the middle first guide portion 2a2 of the three first guide portions 2a1 to 2a3 illustrated on the upper side of the adjacent intermediate portion 2b2 in FIG. 14A. The solder 3b on the surface of the middle first guide portion 2a2 is also guided to spread outward from the middle portion in FIG. 14A in the right-left direction which is the extending direction of the first guide portion 2a2, as in the case of the innermost first guide portion 2a3.

The solder 3b on the top surface of the intermediate portion 2b2 is in contact with and sandwiched between the solder 3b on the surface of the innermost first guide portion 2a3 and the solder 3b on the surface of the middle first guide portion 2a2. The solder 3b on the top surface of the intermediate portion 2b2 is also guided to flow in the right-left direction in association with the solders 3b flowing on both sides of the intermediate portion 2b2, as illustrated in FIG. 14B.

Figure 14B:
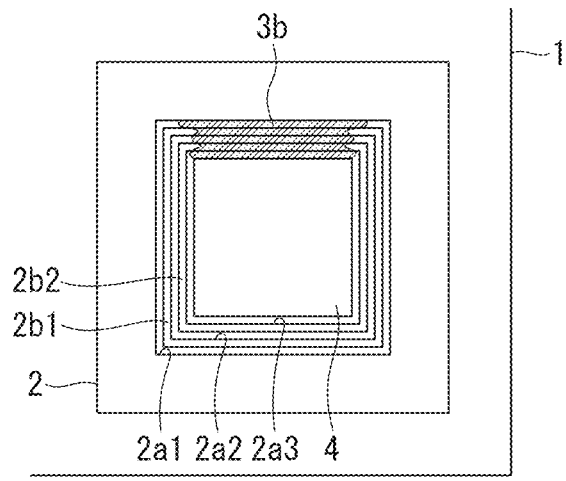

The remaining solder 3b not trapped on the surface of the middle first guide portion 2a2 also moves to the top surface of the intermediate portion 2b1 illustrated on the upper side of the middle first guide portion 2a2 in FIG. 14B. The remaining solder 3b still not trapped on the top surface of the intermediate portion 2b1 further moves to the surface of the outermost first guide portion 2a1 of the three first guide portions 2a1 to 2a3 illustrated on the upper side of the adjacent intermediate portion 2b1 in FIG. 14B. The flowing state of the solder 3b on each of the top surface of the intermediate portion 2b1 and the surface of the outermost first guide portion 2a1 is the same as that of the solder 3b on each of the top surface of the intermediate portion 2b2 and the surface of the middle first guide portion 2a2. Namely, the solder 3b is guided to spread integrally in the same direction along the respective surfaces of the three first guide portions 2a1 to 2a3 and the two intermediate portions 2b1 and 2b2.

Figure 14C:
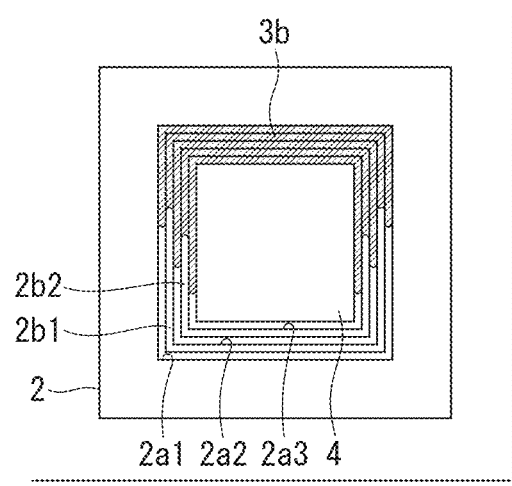
Figure 14D:
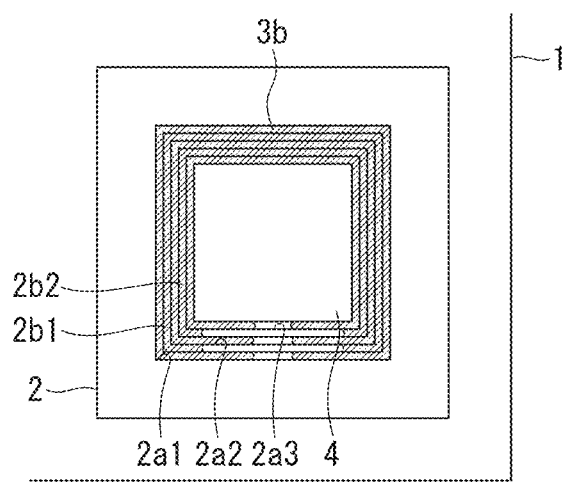

The flowing solder 3b then turns the corners at both ends on the upper side of the rectangular outline of the respective first guide portions 2a1 to 2a3 to reach the right and left sides, and the flowing direction changes from the upward direction to the downward direction, as illustrated in FIG. 14C. Namely, the flowing direction of the solder 3b shifts to the direction opposite to the direction from the semiconductor chip 4 as a flowing start point to the intermediate portions 2b1 and 2b2 on the upper side (opposite to the direction from the lower side to the upper side). When the flowing solder 3b turns the corners at both lower ends of the right and left sides to reach the lower side of the rectangular outline of the respective first guide portions 2a1 to 2a3, the solder 3b then shifts the direction to flow from the outer side toward the middle, as illustrated in FIG. 14D.

As illustrated in FIG. 14A to FIG. 14D, the solder 3b is integrally guided to move along the surfaces of the first guide portions 2a1 to 2a3 and the top surfaces of the intermediate portions 2b1 and 2b2 while circling around the semiconductor chip 4. The solder 3b thus spreads over the entire regions inside the closed surfaces of the frames defined by the first guide portions 2a1 to 2a3.

The solder 3b remains to be localized only inside the closed surfaces defined by the first guide portions 2a1 to 2a3 when the solder 3b stops flowing. The solder 3b is then cooled and solidified so as to ensure the electrical connection between the metal plate 2 and the semiconductor chip 4.

The other circuit elements other than the semiconductor chip 4 are then subjected to predetermined connection processing, such as soldering, wire bonding and the like, and the laminated substrate (1, 2) is sealed with resin by transfer molding and the like, so as to fabricate the semiconductor module according to the first embodiment. In the obtained semiconductor module, excessive wetting-spread of the solder 3 is suppressed, and the fillet shape is achieved to be in a desired pattern.

First Comparative Example

Figure 15:
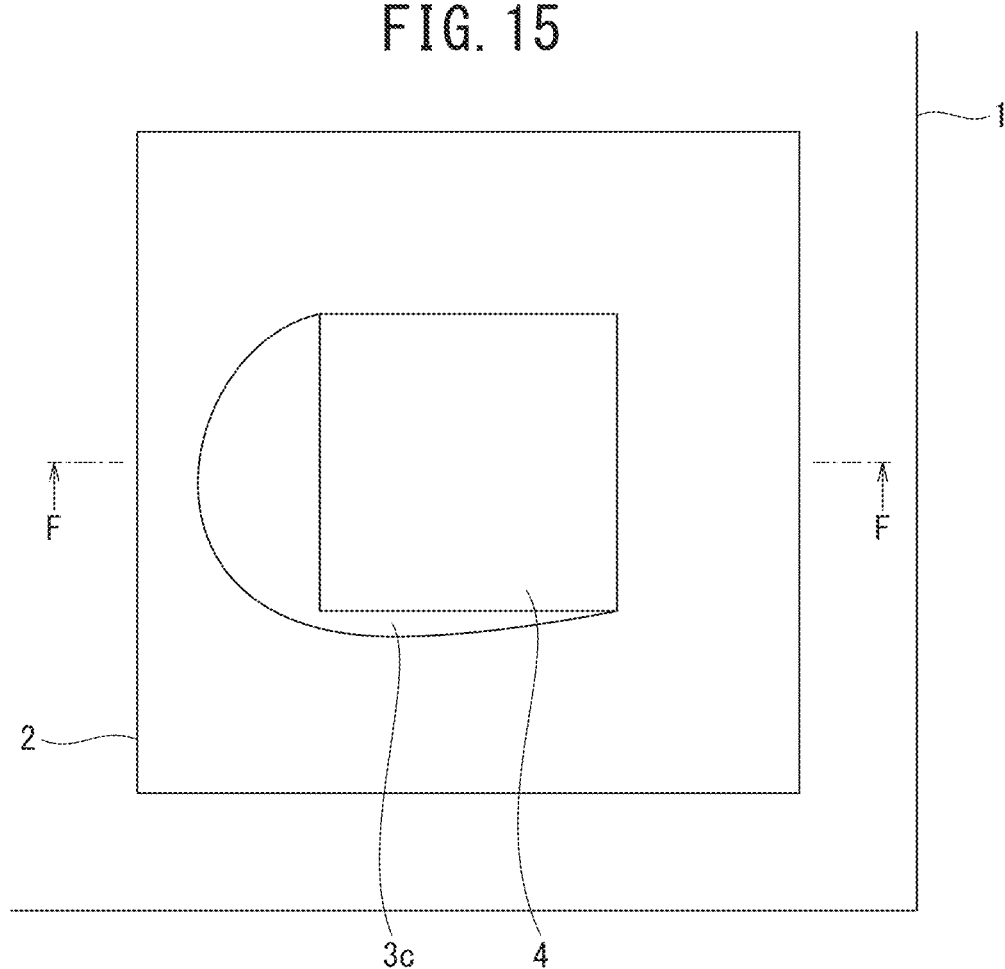
FIG. 15 is a schematic plan view illustrating a configuration of a semiconductor module according to a first comparative example.

As illustrated in FIG. 15, a semiconductor module according to a first comparative example in which no guide portion is provided, cannot regulate the flowing direction of the solder 3c, which flows mainly in one direction (to the left in FIG. 15) and excessively spreads over an unnecessary portion on the metal plate 2. If the solder 3c spreads to a wire bonding portion located adjacent to the semiconductor chip 4, for example, failure such as poor connection may be caused during the bonding process. Since the semiconductor module according to the first comparative example has low adhesion between the solder 3c and the sealing resin used for sealing the laminated substrate (1, 2), the sealing resin in contact with the solder 3c is easily separated from the solder 3c if the solder 3c excessively spreads out. The separation of the solder 3c may cause a short circuit of the semiconductor module.

Figure 16:
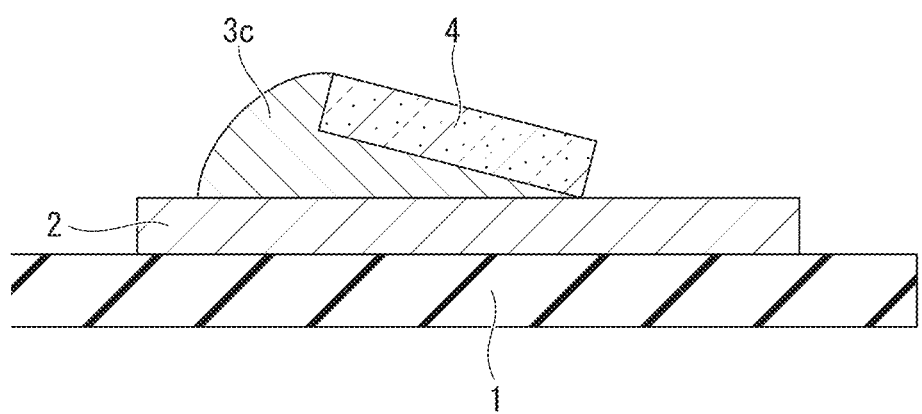
FIG. 16 is a cross-sectional view as viewed from direction F-F in FIG. 15.

Further, as illustrated in FIG. 16, the semiconductor module according to the first comparative example cannot keep the solder 3c uniform under the semiconductor chip 4, resulting in an uneven thickness. The uneven thickness causes cracks or increases heat resistance of the semiconductor module. The uneven thickness also causes a positional shift of the semiconductor chip 4 to the outside of the predetermined arrangement region of the semiconductor chip 4, or displacement due to rotation, for example.

Second Comparative Example

Figure 17:
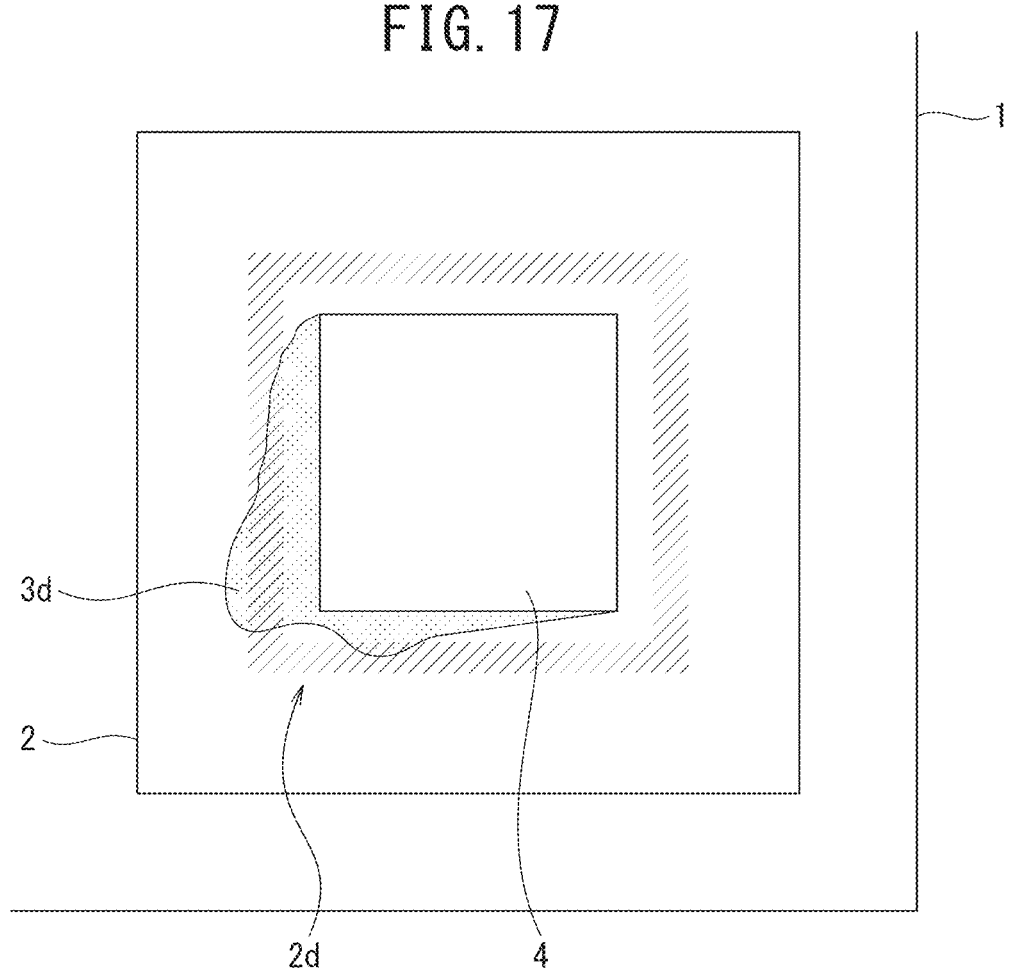
FIG. 17 is a schematic plan view illustrating a configuration of a semiconductor module according to a second comparative example.

FIG. 17 illustrates a semiconductor module according to a second comparative example provided with a plurality of lines surrounding the semiconductor chip 4 on the top surface of the metal plate 2 to entirely define an expansion-inhibiting region 2d, which is distant from the semiconductor chip 4. The expansion-inhibiting region 2d has a rectangular frame-like shape in a planar pattern, and the respective lines defining the expansion-inhibiting region 2d on the surface of the metal plate 2 are processed by irradiation with a laser light. The lines on the processed surface are delineated obliquely so as to intersect with both of the vertical sides and the lateral sides of the rectangular outline of the semiconductor chip 4. The semiconductor module according to the second comparative example is provided with no linear guide portions defining the closed surfaces inside the guide portions around the semiconductor chip 4, in contrast to the semiconductor module according to the first embodiment.

The lines on the processed surface in the expansion-inhibiting region 2d are covered with the oxide films 5a1 to 5a3, as illustrated in FIG. 7A, formed during the laser irradiation, and the oxide films 5a1 to 5a3 remain without being removed. Since the direction of the solder 3d moving outward from the semiconductor chip 4 to flow to the plural lines on the processed surface of the expansion-inhibiting region 2d, is not regulated, the solder 3d is not guided to remain in the expansion-inhibiting region 2d. The solder 3d then further spreads to the outside of the expansion-inhibiting region 2d. The second comparative example cannot suppress excessive wetting-spread of the solder 3d sufficiently, or cannot control the fillet shape of the solidified solder 3d, failing to effectively avoid failure such as poor contact or separation of the sealing resin on the top surface of the metal plate 2.

The method of manufacturing the semiconductor module according to the first embodiment intentionally regulates the flowing direction of the solder 3b by the first guide portions 2a1 to 2a3 so that the solidified solder 3 is localized only in the closed surfaces inside the first guide portions 2a1 to 2a3. The method thus can accurately prevent unnecessary spread of the solder 3 to the outside of the closed surfaces, and guide the solder 3b to circle around the semiconductor chip 4 in preferred directions, so as to achieve an appropriate fillet shape depending on the specifications of design that a client desires. Accordingly, the high-quality semiconductor module can be manufactured while failure caused by excessive wetting-spread is avoided. The suppression of excessive wetting-spread can prevent a short circuit of the semiconductor module caused by the separation of the sealing resin used for sealing the laminated substrate (1, 2).

The method of manufacturing the semiconductor module according to the first embodiment regulates the flowing direction of the solder 3b to guide the solder 3b to circle along the closed surfaces during the period from the start to the end of the flow of the solder 3b, so as to promote the equalization of the thickness of the solder 3b after flowing. The method thus can prevent cracks derived from an uneven thickness and avoid an increase in heat resistance of the semiconductor module. The method can further avoid an unnecessary positional shift or displacement caused by rotation of the semiconductor chip 4 derived from an uneven thickness.

Since the semiconductor module according to the first embodiment is provided with the three first guide portions 2a1 to 2a3, the respective first guide portions 2a1 to 2a3 complement each other to regulate the flowing direction of the solder 3b. Accordingly, excessive wetting-spread of the solder 3b can be prevented more accurately.

The semiconductor module according to the first embodiment can inhibit the formation of the oxide films 5a1 to 5a3 only by causing the flux-containing solder to flow to come in contact with the surfaces of the first guide portions 2a1 to 2a3. Namely, the semiconductor module does not need to have a particular process before the step of irradiation with the laser light and the step of soldering, so as to decrease the load upon executing the process.

The method of manufacturing the semiconductor module according to the first embodiment positively removes the oxide films 5a1 to 5a3 from the surfaces of the first guide portions 2a1 to 2a3, in contrast to the conventional means of preventing the wetting-spread of the solder 3b using the oxide films 5a1 to 5a3. In general, in order to increase the thickness of the oxide films 5a1 to 5a3 by the laser irradiation, it is required to irradiate with the laser light having relatively large output power. The method according to the first embodiment does not need the formation of the oxide films 5a1 to 5a3, and is only required to be irradiated with the laser light with low output power sufficient to increase the surface roughness of the first guide portions 2a1 to 2a3. The low output power of the laser light can reduce the load upon executing the laser processing. While the conventional means using the oxide films 5a1 to 5a3 only prevents the wetting-spread of the solder, the method of manufacturing the semiconductor module according to the first embodiment causes the solder 3a to circle around the semiconductor chip 4 so as to not only prevent the wetting-spread of the solder 3a but also contribute to equalizing the thickness of the solder 3a and controlling the fillet to have an appropriate shape.

The method of manufacturing the semiconductor module according to the first embodiment delineates the first guide portions 2a1 to 2a3 such that the outermost first guide portion 2a1 is separate from the semiconductor chip 4 with the width w which is the same value as the thickness t of the solder 3. The angle θ between the top surface of the metal plate 2 and the inclined side surface of the solder 3 thus approximates to 45 degrees, so as to keep the good bonding conditions of the solder.

Second Embodiment

As described above, in the semiconductor module according to the first embodiment, the linear first guide portions 2a1 to 2a3 are delineated so as to have the closed surfaces inside the first guide portions 2a1 to 2a3 in a planar pattern, in other words, the first guide portions 2a1 to 2a3 are delineated such that both ends of the respective lines are connected to each other so as not to have open ends. A semiconductor module according to a second embodiment differs from the semiconductor module according to the first embodiment in that a second linear guide portion is not connected at both ends to have an open end and to define a closed surface inside the second guide portion. Moreover, in a method for manufacturing the semiconductor module according to the second embodiment, a step of suppressing formation of the oxide films 5a1 to 5a3 during the laser irradiation is executed as the step of inhibiting the formation of the oxide films 5a1 to 5a3, instead of the step of removing the preliminarily formed oxide films 5a1 to 5a3 later.

As illustrated in FIG. 18, the semiconductor module according to the second embodiment includes the laminated substrate (1, 2) having the insulating plate 1 and the metal plate 2 bonded on the top surface of the insulating plate 1, and connection terminals 6a, 6b, 6c mounted on the metal plate 2 via solders 3fa, 3fb, 3fc. The connection terminals 6a to 6c each correspond to a "component-to-be-bonded" according to the present invention.

The connection terminals 6a to 6c are electrically connected to the semiconductor chip 4 so as to implement input/output wiring of current or signal wiring for the semiconductor chip 4. FIG. 18 illustrates the connection terminals 6a to 6c are bonded to the same metal plate 2 as the semiconductor chip 4, and electrically connected to a rear surface electrode of the semiconductor chip 4. For the connection terminals 6a to 6c, a material having high electrical conductivity, such as copper and a copper alloy, may be adopted. Each surface of the connection terminals 6a to 6c may be covered with a plating layer. For the plating layer, nickel, gold, tin, and an alloy including at least one of these metals may be adopted. The connection terminals 6a to 6c may be columnar or prismatic pin terminals, or may be cylindrical contact components into which pin terminals are inserted. The connection terminals 6a to 6c may also be plate-like lead frames. The pin terminal, the contact part, and the like are not limited to a shape that simply extends linearly, and may be arbitrarily bent in the middle. Also, the lead frame and the like are not limited to a uniformly flat plate shape as a whole, but may be partially arbitrarily bent or may have a curved surface. More specifically, the shapes of the connection terminals 6a to 6c may be determined as appropriate.

FIG. 18 is a top view as viewed from the semiconductor chip 4 side, and illustrates a wetting-spread portion 3h of the solder indicated by a dot-like pattern on the inner side around the connection terminals 6a to 6c in the region of the second guide portion 2e on the top surface of the metal plate 2. The second guide portion 2e on the metal plate 2 below the wetting-spread portion 3h is defined by the broken line. The second guide portion 2e extending straight in the upper-lower direction in FIG. 18 is arranged on the left side of the connection terminals 6a to 6c so that the entire second guide portion 2e is located on the inner side of the solidified solders 3fa to 3fc and the wetting-spread portion 3h of the solder in a planar pattern. The second guide portion 2e guides the melting solders 3fa to 3fc to flow in the extending direction of the line of the second guide portion 2e (in the upper-lower direction in FIG. 18).

The wettability of the solder flowing toward the semiconductor chip 4 is regulated by the second guide portion 2e. The configurations of the other elements in the semiconductor module according to the second embodiment are equivalent to those of the corresponding elements in the semiconductor module according to the first embodiment, and overlapping explanations are not repeated below.

Figure 19A:
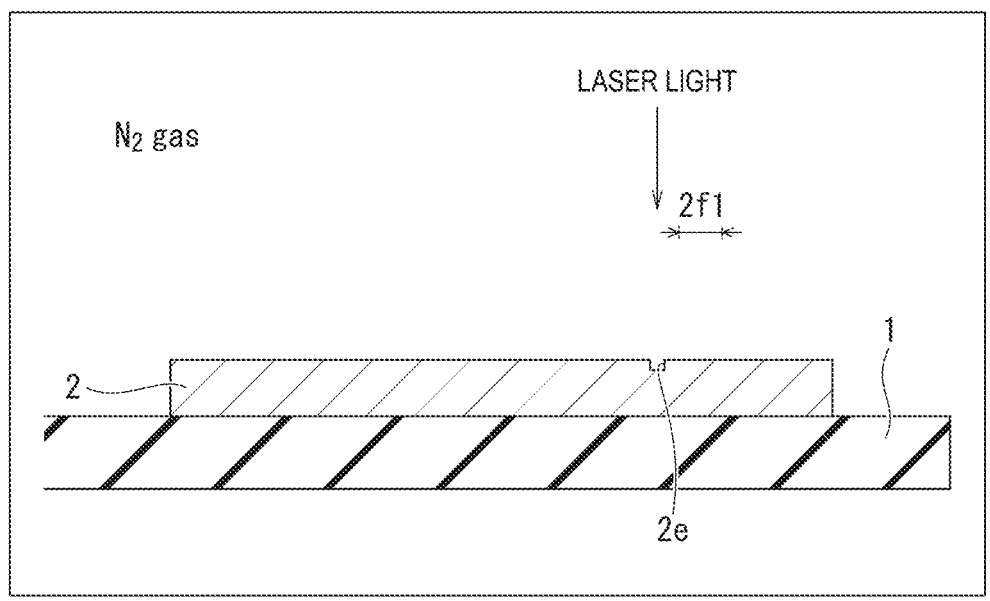
FIG. 19A is a schematic cross-sectional view illustrating a method of preventing oxidation by irradiating a laser light in an inert gas atmosphere to inhibit a formation of an oxide film, in a step of a manufacturing method for the semiconductor module according to the second embodiment.
Figure 19B:
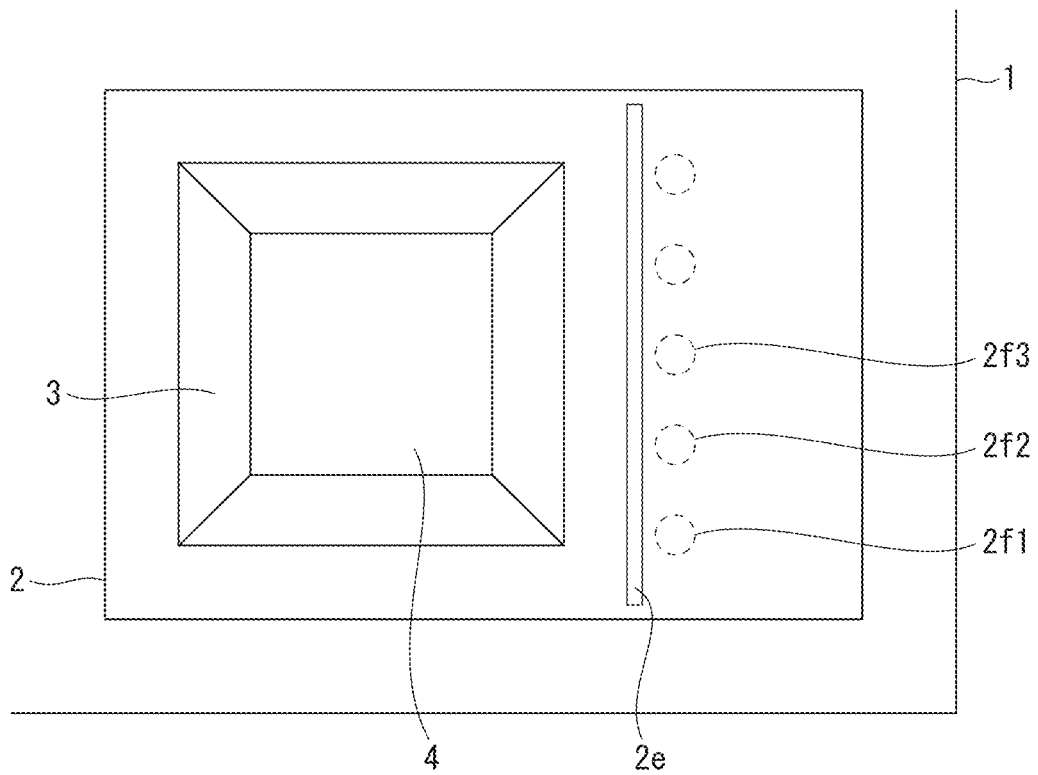
FIG. 19B is a schematic plan view illustrating the manufacturing method for the semiconductor module according to the second embodiment.

The second guide portion 2e is obtained such that the surface of the metal plate 2 is processed by irradiation with a laser light, in the same manner as the first guide portions 2a1 to 2a3 according to the first embodiment. As illustrated in FIG. 19A, the laser light is irradiated in an inert gas atmosphere, such as an atmosphere of high-purity nitrogen ($N_2$) or argon (Ar) containing extremely small oxygen ($O_2$) content, before a step of applying the solders 3fa to 3fc. The laser light is irradiated on the left side in parallel to a direction in which second soldering-scheduled regions 2f1 to 2f3 are aligned straight on the top surface of the metal plate 2, as illustrated in FIG. 19B. According to the second embodiment, since the laser light is irradiated in the inert gas atmosphere, the second guide portion 2e is increased in surface roughness more than the peripheral regions, while the formation of oxide films is suppressed. The second guide portion 2e is flat, or recessed as compared with the peripheral regions. By the suppression of formation of oxide films, the step of removing the oxide films 5a1 to 5a3 from the method according to the first embodiment can be omitted.

The second guide portion 2e has a surface roughness higher than that of the peripheral regions and is made of a metal surface having a rough uneven shape. Therefore, in the soldering process, even when the solders 3fa to 3fc at the time of melting tends to flow toward the semiconductor chip 4 side (the left direction in FIG. 18), the solders 3fa to 3fc are guided in a direction orthogonal to the flow direction toward the semiconductor chip 4 side by the second guide portion 2e. The second guide portion 2e thus blocks the movement of the melting solders 3fa to 3fc toward the semiconductor chip 4 so as to prevent the solders 3fa to 3fc from being bonded to the solder 3 below the semiconductor chip 4.

Figure 20:
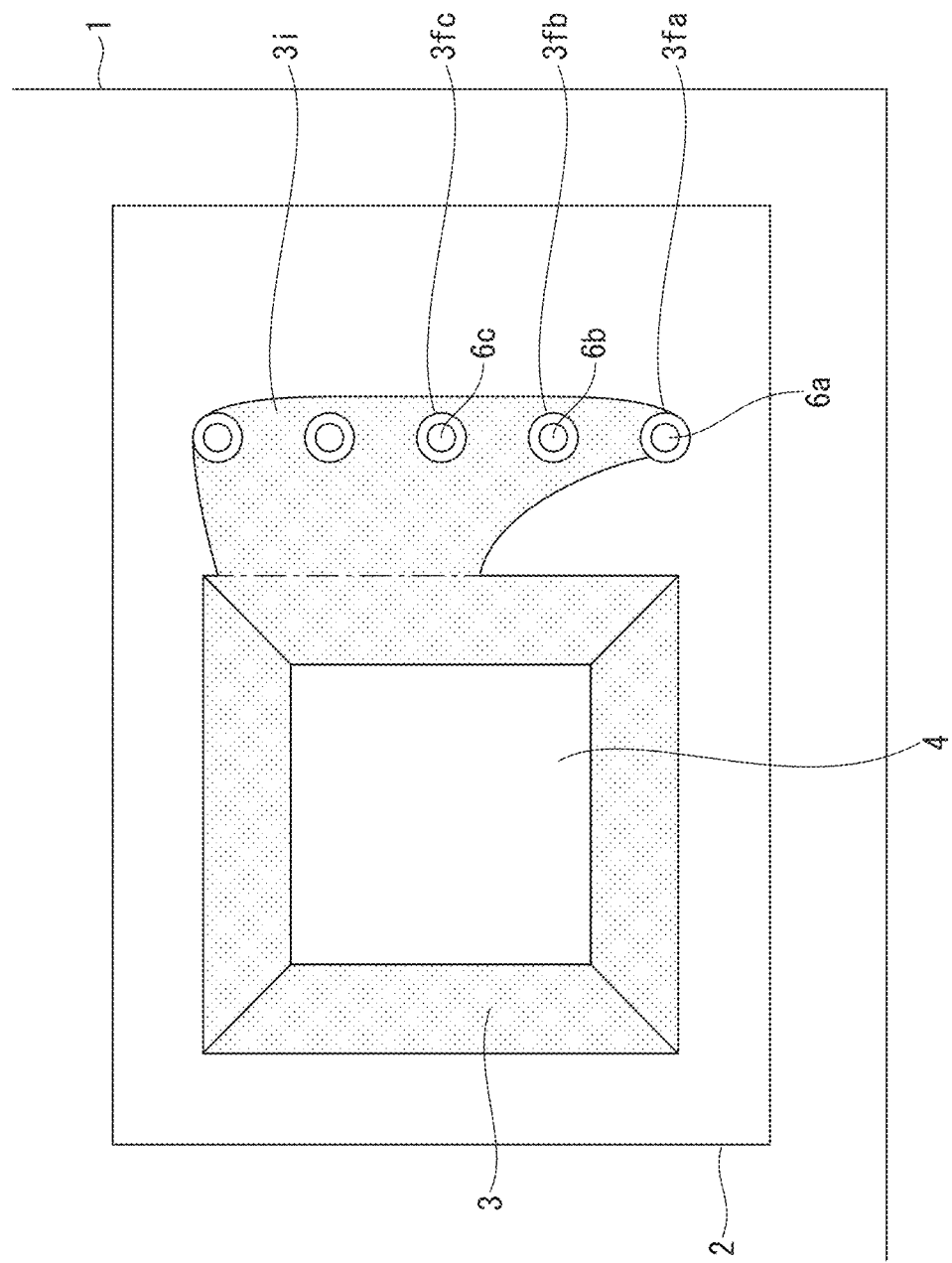
FIG. 20 is a schematic plan view illustrating a configuration of a semiconductor module according to a third comparative example.

On the contrary, a semiconductor module according to a third comparative example as illustrated in FIG. 20 is not provided with the second guide portion 2e at the boundary between the semiconductor chip 4 and the connection terminals 6a to 6c. Therefore, the flow of the solders 3fa to 3fc, before being solidified, located under the connection terminals 6a to 6c to the semiconductor chip 4 side is not blocked, and the solders 3fa to 3fc and the solder 3 on the semiconductor chip 4 side are bonded. When the solders 3fa to 3fc on the side of the connection terminals 6a to 6c and the solder 3 on the semiconductor chip 4 side are greatly connected like a wetting-spread portion 3i of the solder illustrated in FIG. 20, the adhesion to the sealing resin will decrease. Further, due to flow of the solders 3fa to 3fc on the connection terminals 6a to 6c side toward the solder 3 on the semiconductor chip 4 side, the amount of the solders 3fa to 3fc on the connection terminals 6a to 6c side may decrease, and the necessary bonding force sometimes can not be maintained.

The semiconductor module according to the second embodiment provided with the second guide portion 2e at the boundary between the semiconductor chip 4 and the connection terminals 6a to 6c, can prevent the solder 3 on the semiconductor chip 4 side from being bonded to the solders 3fa to 3fc on the connection terminals 6a to 6c side. The other effects of the semiconductor module according to the second embodiment are the same as those of the semiconductor module according to the first embodiment.

First Modified Example

Figure 21A:
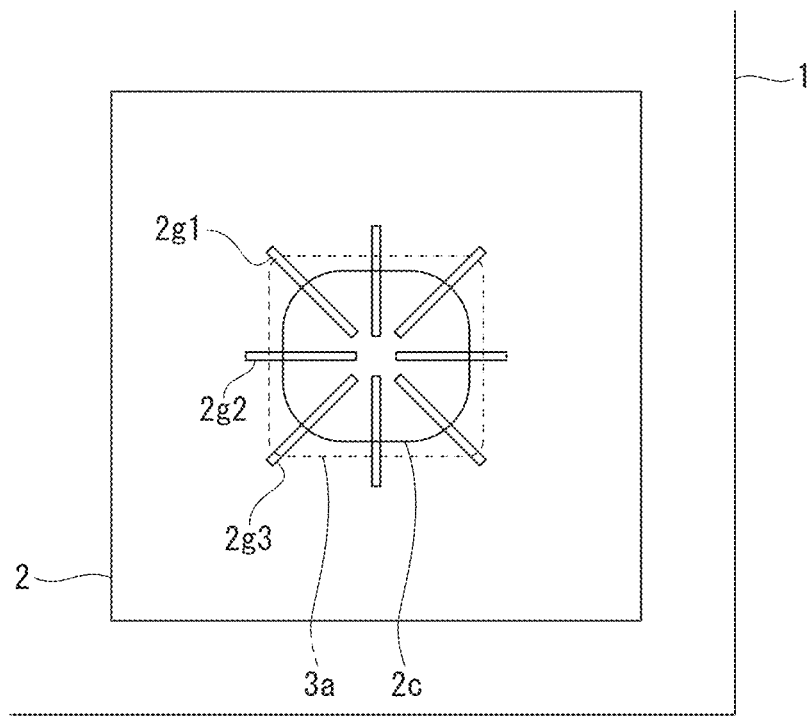
FIG. 21A is a schematic plan view illustrating a configuration of a semiconductor module including guide portions radially extending according to a first modified example.

As illustrated in FIG. 21A, linear second guide portions 2g1, 2g2, 2g3 having open ends may be arranged in a region below the semiconductor chip 4 on the top surface of the metal plate 2. In the semiconductor module according to the first modified example, the eight linear second guide portions 2g1 to 2g3 are formed in a region below the semiconductor chip 4 on the top surface of the metal plate 2 so as to extend in a radial-shape toward the outside in a planar pattern.

The eight linear second guide portions 2g1 to 2g3 are arranged with gaps at a regular angle of about 45 degrees, and each extend in a radial-shape while intersecting with the outline of the first soldering-scheduled region 2c at one point. The second guide portions 2g1 to 2g3 according to the first modified example can also be obtained by a treated surface using irradiation with a laser light as like the first guide portions 2a1 to 2a3, and surface roughness is higher than the peripheral regions. The semiconductor module according to the first modified example has a metal surface without an oxide film by removing the oxide film during manufacturing process, or inhibiting formation of the oxide film during manufacturing process. The configurations of the other elements in the semiconductor module according to the first modified example are equivalent to those of the corresponding elements in the respective semiconductor modules described with reference to FIG. 1 to FIG. 20, and overlapping explanations are not repeated below.

As described above, the semiconductor module according to the first modified example includes the second guide portions 2g1 to 2g3 arranged with gaps at a regular angle while extending in a radial-shape from the center to the outside. Since the solder for bonding the semiconductor chip 4 provided in the first soldering-scheduled region 2c is guided to evenly flow outward, the equalization of the thickness of the solder below the semiconductor chip 4 can be enhanced. The other effects of the semiconductor module according to the first modified example are the same as those of the semiconductor modules according to the first and second embodiments.

Figure 21B:
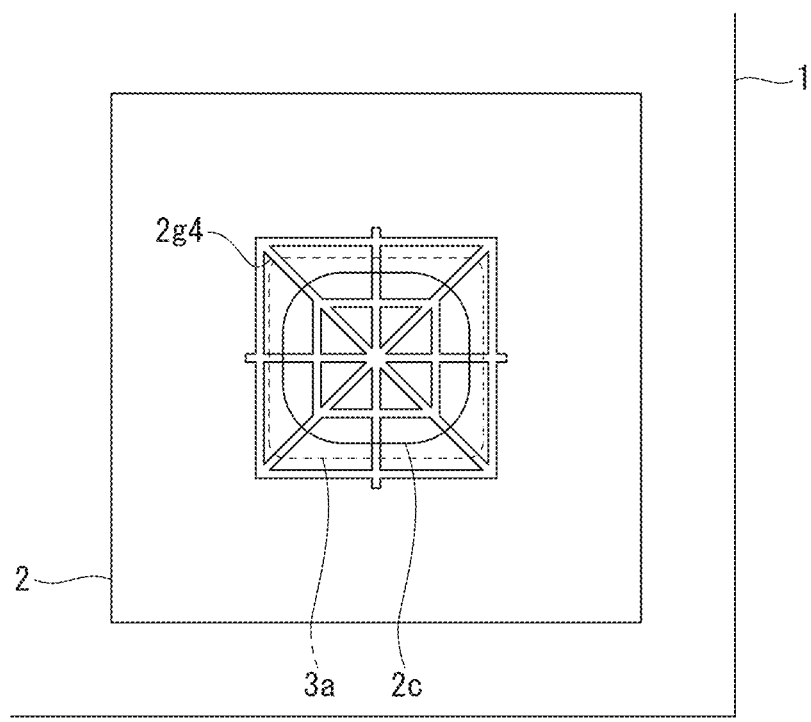
FIG. 21B is a schematic plan view illustrating a configuration of the semiconductor module including a guide portion extending in a meshed-shape according to the first modified example.

As illustrated in FIG. 21B, a linear second guide portion 2g4 having open ends may be arranged into a meshed-shape with gaps in the region below the semiconductor chip 4 on the top surface of the metal plate 2. The second guide portion 2g4 can also achieve the same effects as the second guide portions 2g1 to 2g3.

Second Modified Example

Figure 22:
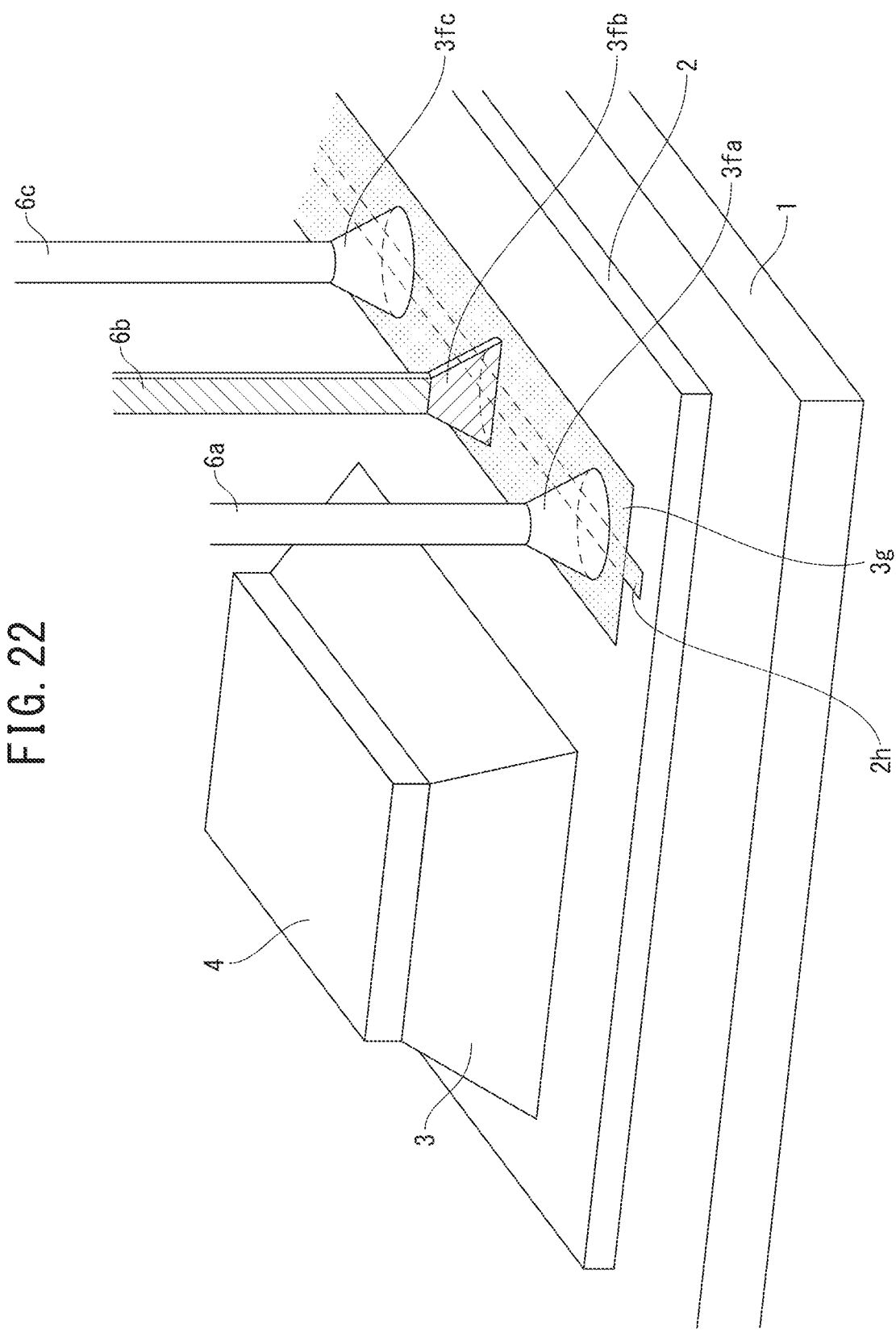
FIG. 22 is a schematic perspective view partly illustrating a configuration of a semiconductor module according to a second modified example of the present invention.

As illustrated in FIG. 22, a linear second guide portion 2h having open ends may be arranged below and in parallel to the three connection terminals $6a$ to $6c$ aligned straight on the top surface of the metal plate 2. A semiconductor module according to a second modified example includes the single second guide portion $2h$ extending straight below the solders $3fa$ to $3fc$ for bonding the connection terminals $6a$ to $6c$ on the top surface of the metal plate 2. FIG. 22 illustrates a wetting-spread portion $3g$ of the solder around the second guide portion $2h$ and the respective solders $3fa$ to $3fc$.

The second guide portions $2h$ according to the second modified example can also be obtained by a treated surface using irradiation with a laser light as like the first guide portions $2a1$ to $2a3$, and surface roughness is higher than the peripheral regions. The semiconductor module according to the second modified example has a metal surface without an oxide film by removing the oxide film during manufacturing process, or inhibiting formation of the oxide film during manufacturing process. The configurations of the other elements in the semiconductor module according to the second modified example are equivalent to those of the corresponding elements in the respective semiconductor modules described with reference to FIG. 1 to FIG. 21, and overlapping explanations are not repeated below.

In the semiconductor module according to the second modified example, the second guide portion $2h$ extends immediately below the connection terminals $6a$ to $6c$ and are arranged in parallel to the direction in which the connection terminals $6a$ to $6c$ are aligned straight. The respective solders $3fa$ to $3fc$ for bonding the connection terminals $6a$ to $6c$ are thus guided to flow to remain around the connection terminals $6a$ to $6c$. Thus, the excessive wetting-spread of the solders $3fa$ to $3fc$ below the connection terminals $6a$ to $6c$ is avoided so as to prevent the solders $3fa$ to $3fc$ from being bonded to the solder 3 below the semiconductor chip 4. Further, it is possible to prevent the bias of the solders $3fa$ to $3fc$ to some of the connection terminals $6a$ to $6c$ at the connection terminals $6a$ to $6c$. The second guide portion $2h$ located below the respective connection terminals $6a$ to $6c$ illustrated in FIG. 22 seems to be partly covered with the solders $3fa$ to $3fc$, but is actually connected below the connection terminals $6a$ to $6c$ since the surface has a rough uneven shape. Accordingly, the performance of guiding the solders $3fa$ to $3fc$ to flow in the appropriate directions is improved. The other effects of the semiconductor module according to the second modified example are the same as those of the respective semiconductor modules according to the first and second embodiments.

Third Modified Example

Figure 23:
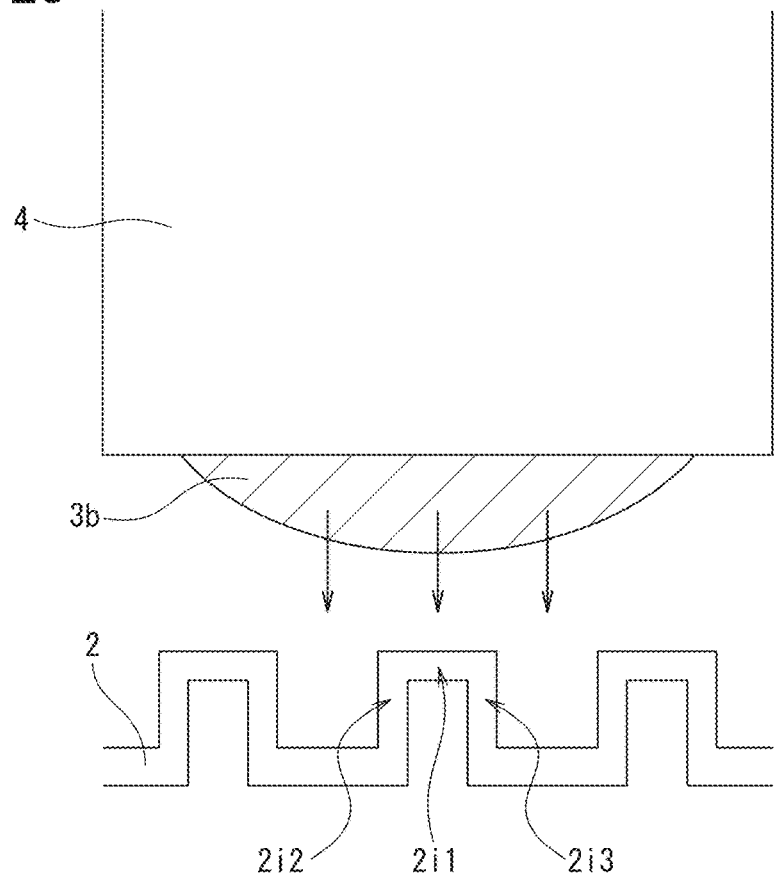
FIG. 23 is a schematic plan view illustrating a configuration of a semiconductor module according to a third modified example.

The linear second guide portion having open ends is not limited to the straight-line shape, and may be any shape, such as a curved shape, a zig-zag shape and the like. As an example, in FIG. 23, a second guide portion ($2i1$, $2i2$, $2i3$) formed in a crankshaft shape is provided around the semiconductor chip 4 on the top surface of the metal plate 2 in a planar pattern. The gap between the second guide portion ($2i1$, $2i2$, $2i3$) and the semiconductor chip 4 illustrated in FIG. 23 is exaggerated for illustration purposes. As described in the first embodiment, however, the position of the outline of the second guide portion ($2i1$, $2i2$, $2i3$) is determined depending on the distance from the semiconductor chip 4 in view of the volume of the solder $3b$, and the second guide portion ($2i1$, $2i2$, $2i3$) is arranged so as to be located entirely on the inner side of the solidified solder.

The second guide portion ($2i1$, $2i2$, $2i3$) includes plural sets of a perpendicular portion $2i1$ perpendicular to the flowing direction of the solder $3b$ (the direction from the upper side to the lower side in FIG. 23), and parallel portions $2i2$ and $2i3$ perpendicular to the perpendicular portion $2i1$ and parallel to the flowing direction of the solder $3b$. The perpendicular portion $21i$ and the parallel portions $2i2$ and $2i3$ are alternately arranged so as to entirely define the liner second guide portion ($2i1$, $2i2$, $2i3$). The perpendicular portion $2i1$ turns at 45 degrees in the flowing direction of the solder $3b$ in the same manner as the first guide portions $2a1$ to $2a3$ according to the first embodiment. The parallel portions $2i2$ and $2i3$ absorb and relax the flowing force of the solder $3b$ without resisting when the flowing solder $3b$ reaches the parallel portions $2i2$ and $2i3$.

The second guide portion ($2i1$, $2i2$, $2i3$) according to the third modified example can also be obtained by a treated surface using irradiation with a laser light as like the first guide portions $2a1$ to $2a3$, and surface roughness is higher than the peripheral regions. The semiconductor module according to the third modified example has a metal surface without an oxide film by removing the oxide film during manufacturing process, or inhibiting formation of the oxide film during manufacturing process. The configurations of the other elements in the semiconductor module according to the third modified example are equivalent to those of the corresponding elements in the respective semiconductor modules described with reference to FIG. 1 to FIG. 22, and overlapping explanations are not repeated below.

The semiconductor module according to the third modified example includes the second guide portion ($2i1$, $2i2$, $2i3$) which guides the solder $3b$ to change the flowing direction due to the perpendicular portion $2i1$ while relaxing the force of the flowing solder $3b$ due to the perpendicular portions $2i2$ and $2i3$. The excessive wetting-spread of the solder $3b$ thus can be suppressed more efficiently. Moreover, even if the number of the lines defining the second guide portion ($2i1$, $2i2$, $2i3$) is small, the effectiveness of suppressing the wettability can be kept high. The other effects of the semiconductor module according to the third modified example are the same as those of the respective semiconductor modules according to the first and second embodiments. Both ends of the second guide portion ($2i1$, $2i2$, $2i3$) having the crankshaft shape may be connected to define the closed surface inside the second guide portion ($2i1$, $2i2$, $2i3$), so as to arrange the solder $3b$ and the semiconductor chip 4 inside the closed surface, as in the case of the first embodiment.

Other Embodiments

While the present invention has been described above by reference to the embodiments, it should be understood that the present invention is not intended to be limited to the descriptions of the specification and the drawings implementing part of this disclosure. From the above disclosure, various alternative embodiments, examples and operational techniques will be apparent to those skilled in the art.

For example, the outline of the first guide portions $2a1$ to $2a3$ defining the closed surfaces inside the first guide portions $2a1$ to $2a3$ in the above embodiment according to the present invention is not limited to the rectangular shape, and the shape of the outline may be determined as appropriate depending on the preferred fillet shape of the solder 3. In addition, the position of arrangement of the first guide portions $2a1$ to $2a3$ defining the closed surfaces inside the first guide portions $2a1$ to $2a3$ is not limited to the circumference of the semiconductor chip 4, and the first guide portions $2a1$ to $2a3$ may be arranged around the components to be bonded such as the connection terminals.

The number of the first guide portions defining the closed surfaces inside the first guide portions may be one, two, or more than three, which may be determined as appropriate. When one or more first guide portions are provided, all of the first guide portions are arranged around the semiconductor chip 4 to be located inside the region having the predetermined width w, so that the angle θ between the top surface of the metal plate 2 and the inclined side surface of the solder 3 can approximate to 45 degrees.

The first embodiment has been illustrated with the case in which the soldering step brings the flux for soldering into contact with the oxide films 5a1 to 5a3 provided on the surfaces of the regions irradiated with the laser light so as to remove the oxide films 5a1 to 5a3. The method of removing the oxide films is not limited to this step. For example, the flux for soldering containing a reductant may be applied to the surfaces of the first guide portions 2a1 to 2a3 and then heated after the irradiation with the laser light and before the soldering step, so as to remove the oxide films 5a1 to 5a3.

Figure 24:
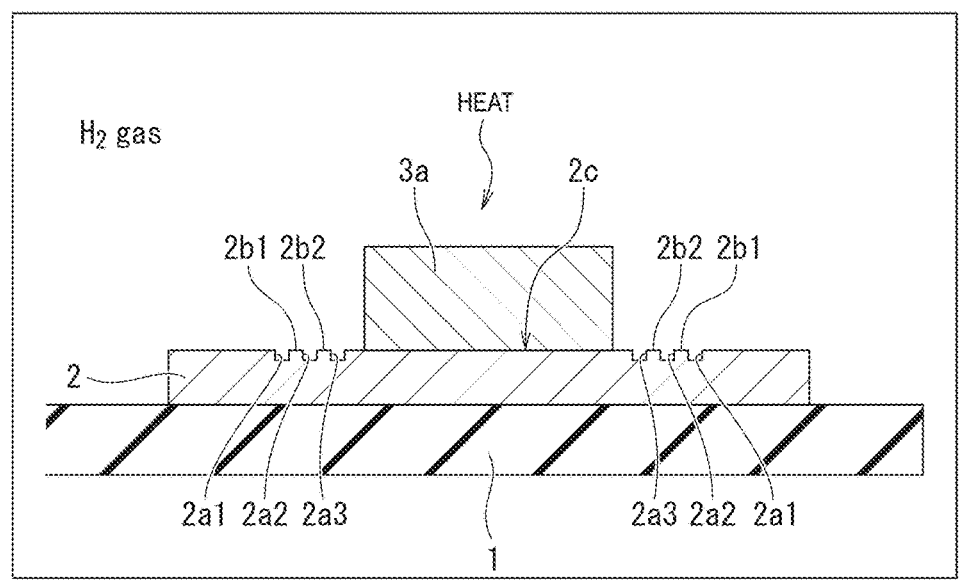
FIG. 24 is a schematic cross-sectional view illustrating a method of removing oxide films formed by soldering in a reduction atmosphere, as a step of inhibiting a formation of oxide films.

For example, as illustrated in FIG. 24, the oxide films may be removed such that the laminated substrate (1, 2) is inserted in a reducing furnace containing a reductant gas, such as hydrogen ($H_2$) and the like, and is then heated during the heating and melting processing in the soldering step. The use of the reducing furnace has the advantage of expanding the selection of the material used for the solder 3 without the limitation to the flux-containing solder.

The second embodiment has been illustrated with the case in which the formation of the oxide films 5a1 to 5a3 is inhibited by the irradiation with the laser light in the inert gas atmosphere. This method can simultaneously execute the soldering step in the inert gas atmosphere. This method has the advantage of expanding the selection of the material used for the solder 3 without the limitation to the flux-containing solder or without executing the soldering step in the reduction atmosphere.

The first embodiment according to the present invention has been illustrated with the case in which the oxide films are formed by the irradiation with the laser light in the oxidation atmosphere, and the oxide films are removed in the following reducing step, so as to delineate the first guide portions 2a1 to 2a3. On the contrary, the second embodiment according to the present invention has been illustrated with the case in which the formation of the oxide films is inhibited by the irradiation with the laser light in the inert gas atmosphere, so as to delineate the second guide portion 2e. The respective methods according to the first and second embodiments may be exchanged to each other.

The type of the semiconductor in the semiconductor chip 4 may be determined as appropriate, and may be Si or SiC, for example. The method of the solder bonding according to the present invention is not limited to the soldering used for the semiconductor chip 4 and the connection terminals, and may also be applied to the soldering used for various kinds of components to be bonded, including various electronic components, such as a thermistor, a capacitor and the like, and elements for various terminals such as a lead frame and the like. The method of the solder bonding according to the present invention can also be applied to a process of soldering the laminated substrate to a base plate for heat radiation when the laminated substrate made of ceramics is used as a component-to-be-bonded according to the present invention.

The elements included in the respective semiconductor modules according to the respective embodiments and modified examples as illustrated in FIG. 1 to FIG. 24 may partly be combined together. As described above, it should be noted that the present invention includes various embodiments, modifications and the like, which are not described here, such as configurations arbitrarily applied to each of the configurations described in the above embodiment and each modification. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor module comprising:
a metal plate;
a solder applied on the metal plate;
a component-to-be-bonded mounted on the solder,
the metal plate including a linear guide portion delineated along a circumference of the component-to-be-bonded, on a top surface of the metal plate, and the linear guide portion having a roughened metal surface having greater surface roughness than a peripheral region of the metal plate, the roughened metal surface including substantially no oxide film so that the solder is in direct contact with the roughened metal surface, and the solder spreads over the entire roughened metal surface of the linear guide portion.

2. The semiconductor module of claim 1, wherein the linear guide portion comprises a plurality of linear guide portions.

3. The semiconductor module of claim 1, wherein the linear guide portion is arranged so as to be entirely enclosed inside the solder.

4. The semiconductor module of claim 1, wherein:
a closed surface is defined inside the linear guide portion in a planar pattern; and
the solder is applied so as to localize only inside the closed surface.

5. The semiconductor module of claim 2, wherein the component-to-be-bonded is a semiconductor chip.

6. The semiconductor module of claim 5, wherein an outermost one of the linear guide portions has a width corresponding to a thickness of the solidified solder.

7. The semiconductor module of claim 1, wherein the component-to-be-bonded comprises a plurality of components to be bonded, and
wherein the linear guide portion extends in parallel to a direction in which the components to be bonded are aligned straight.

8. The semiconductor module of claim 7, wherein the components to be bonded are connection terminals.

9. The semiconductor module of claim 8, wherein the linear guide portion is located between the connection terminals and a semiconductor chip.

10. The semiconductor module of claim 1, wherein a line of the linear guide portion has open ends.

11. The semiconductor module of claim 1, wherein the linear guide portion includes a perpendicular portion perpendicular to a flowing direction of the solder, and a parallel portion parallel to the flowing direction.

12. The semiconductor module of claim 1, wherein the linear guide portion is located below the component-to-be-bonded.

13. The semiconductor module of claim 12, wherein the linear guide portion comprises a plurality of linear guide portions, and
wherein the linear guide portions extend in a radial-shape or in a meshed-shape on the top surface of the metal plate below the component-to-be-bonded.

14. The semiconductor module of claim 12, wherein the component-to-be-bonded comprises a plurality of components to be bonded, and
   wherein the linear guide portion is located and connected below the components to be bonded.

15. A method for manufacturing a semiconductor module, the method comprising:
   irradiating a circumference of a soldering-scheduled region on a top surface of a metal plate with a laser light to delineate a linear guide portion having a roughened metal surface having greater surface roughness than a peripheral region;
   applying a solder in the soldering-scheduled region of the metal plate;
   mounting, on the applied solder, a component-to-be-bonded to the solder;
   inhibiting a formation of an oxide film at an interface between the solder and the guide portion so that the roughened metal surface includes substantially no oxide film so that the solder is in direct contact with the roughened metal surface; and
   trapping, on a surface of the guide portion, the solder flowing outward from the component-to-be-bonded, so as to guide the solder to flow in an extending direction of the guide portion and the solder spreads over the entire roughened metal surface of the linear guide portion.

16. The method of claim 15, wherein:
   the laser light is irradiated in an oxidation atmosphere; and
   the inhibiting the formation of the oxide film includes removing the oxide film formed on the metal surface of the guide portion by flowing the solder having a flux containing a reductant to the guide portion, and by the irradiation of the laser light.

17. The method of claim 16, wherein:
   the removing the oxide film formed on the metal surface of the guide portion includes preliminarily applying a flux containing a reductant to the guide portion before heating the solder.

18. The method of claim 15, wherein:
   the laser light is irradiated in an oxidation atmosphere; and
   the inhibiting the formation of the oxide film includes removing the oxide film formed on the metal surface of the guide portion by heating the solder in a reducing atmosphere or an inert gas atmosphere.

19. The method of claim 15, wherein the inhibiting the formation of the oxide film includes irradiating the laser light in an inert gas atmosphere so as to suppress the formation of the oxide film on the metal surface of the guide portion.

20. A method of manufacturing the semiconductor module of claim 1, the method comprising:
   irradiating a circumference of a soldering-scheduled region on a top surface of a metal plate with a laser light to delineate a linear guide portion having a metal surface having greater surface roughness than a peripheral region;
   applying a solder in the soldering-scheduled region;
   mounting, on the applied solder, a component-to-be-bonded to the solder;
   inhibiting a formation of an oxide film at an interface between the solder and the linear guide portion; and
   trapping, on a surface of the linear guide portion, the solder flowing outward from the component-to-be-bonded, so as to guide the solder to flow in an extending direction of the linear guide portion.

* * * * *